United States Patent
Posske et al.

(10) Patent No.: US 11,934,917 B2
(45) Date of Patent: Mar. 19, 2024

(54) QUANTUM COMPUTING UNIT WITH MAJORANA MODES

(71) Applicants: UNIVERSITAT HAMBURG, Hamburg (DE); UNIVERSITY OF CHINESE ACADEMY OF SCIENCES (UCAS), Beijing (CN)

(72) Inventors: Thore Posske, Hamburg (DE); Ching-Kai Chiu, Beijing (CN); Michael Thorwart, Hamburg (DE)

(73) Assignees: Universitat Hamburg (DE); University of Chinese Academy of Sciences (CN)

( * ) Notice: Subject to any disclaimer, the term of this patent is extended or adjusted under 35 U.S.C. 154(b) by 329 days.

(21) Appl. No.: 17/396,151

(22) Filed: Aug. 6, 2021

(65) Prior Publication Data
US 2022/0044142 A1 Feb. 10, 2022

Related U.S. Application Data

(60) Provisional application No. 63/062,178, filed on Aug. 6, 2020.

(51) Int. Cl.
*G06N 10/00* (2022.01)
*H10N 60/20* (2023.01)

(52) U.S. Cl.
CPC ............. *G06N 10/00* (2019.01); *H10N 60/20* (2023.02)

(58) Field of Classification Search
None
See application file for complete search history.

(56) References Cited

U.S. PATENT DOCUMENTS 10,333,048 B2 * 6/2019 Barkeshli ............... G06N 10/00
10,346,348 B2 * 7/2019 Hastings ................. G06F 15/80
(Continued)

FOREIGN PATENT DOCUMENTS

EP  3751472 A1 * 12/2020 ............. G06N 10/00

OTHER PUBLICATIONS

M. Cheng et al., "Nonadiabatic effect in braiding of non-Abelian anyons in topological superconductors," Physical Review B 84, 104529, 2011 American Physical Society, 11 pages. (Year: 2011).*

(Continued)

*Primary Examiner* — Leigh M Garbowski
(74) *Attorney, Agent, or Firm* — QUARLES & BRADY LLP

(57) ABSTRACT

The present invention relates to a quantum computing unit comprising a superconducting substrate or other superconducting component, at least three outer Majorana modes, and at least one inner Majorana mode, wherein the at least three outer Majorana modes are located along an outer perimeter, and wherein the at least one inner Majorana mode is located within the outer perimeter. This spatial configuration of the four participating Majorana modes allows to control the time-dependent coupling between the respective Majorana modes. The related quantum gates can be performed perfectly in a finite time, preferably with a frequency of up to several GHz. These include the braiding gate, the π/8 magic phase gate, the π/12 phase gate, and, for multi-qubit systems, the CNOT gate. The robustness of the mechanism guarantees that for special times the quantum gate is conducted the quantum gate is perfectly realized. This property is independent of material specific parameters. Hence, the behavior can be expected in all systems where Majorana zero modes appear in the center of Abrikosov (Continued)

vortices, in particular, not only in FeTeSe, which we consider as an example.

27 Claims, 12 Drawing Sheets

(56) References Cited

U.S. PATENT DOCUMENTS

| | | | | |
|---|---|---|---|---|
| 10,346,761 B2* | 7/2019 | Clarke | | G06N 10/00 |
| 10,404,287 B2* | 9/2019 | Haah | | H03M 13/13 |
| 10,496,933 B1* | 12/2019 | Karzig | | G06N 10/00 |
| 10,622,536 B2* | 4/2020 | Chow | | H10N 60/12 |
| 11,100,419 B2* | 8/2021 | Moodera | | H10N 60/10 |
| 11,380,836 B2* | 7/2022 | Holmes | | H10N 60/12 |
| 11,556,411 B2* | 1/2023 | Cross | | G06N 10/00 |
| 11,696,516 B2* | 7/2023 | Freedman | | H10N 60/128 |
| | | | | 257/36 |
| 2022/0036227 A1* | 2/2022 | Karzig | | G06N 10/20 |
| 2022/0261678 A1* | 8/2022 | Nothhelfer | | G06N 10/40 |

OTHER PUBLICATIONS

B. van Heck et al., "Coulomb-assisted Braiding of Majorana fermions in a Josephson junction array," 2012 New Journal of Physics 14 035019, IOP Publishing Ltd, Institute of Physics, pp. 1-14. (Year: 2012).*

T. Posske et al., "Robustly emulating vortex Majorana braiding in a finite time," arXiv: 1908.03576v1, Aug. 9, 2019, pp. 1-15. (Year: 2019).*

T. Posske et al., "Vortex Majorana braiding in a finite time," arXiv: 1908,03576v2, Feb. 25, 2020, pp. 1-8. (Year: 2020).*

Alicea et al., Non-Abelian Statistics and Topological Quantum Information Processing in 1D Wire Networks, Nature Physics, 2011, 7(5):412-417.

Arute et al., Quantum Supremacy Using a Programmable Superconducting Processor, Nature, 2019, 574(7779):505-511.

Chiu et al., Scalable Majorana Vortex Modes in Iron-Based Superconductors, Science Advances, 2020, 6(9):eaay0443, pp. 1-10.

Das et al., Zero-Bias Peaks and Splitting in an Al-InAs Nanowire Topological Superconductor as a Signature of Majorana Fermions, Nature Physics, 2012, 8(12):887-895.

Elliot et al., Colloquium: Majorana Fermions in Nuclear, Particle, and Solid-State Physics, Reviews of Modern Physics, 2015, 87(1):137-163.

Ge et al., Nanoscale Assembly of Superconducting Vortices with Scanning Tunneling Microscope Tip, Nature Communications, 2016, 7(1):1-7.

Karzig et al., Robust Majorana Magic Gates via Measurements, Physical Review B, 2019, 99(14):144521, pp. 1-13.

Karzig et al., Universal Geometric Path to a Robust Majorana Magic Gate, Physical Review X, 2016, 6(3):031019, pp. 1-14.

Kitaev, Unpaired Majorana Fermions in Quantum Wires, Physics-uspekhi, 2001, 44(10S):131-136.

Liu et al., Protocol for Reading Out Majorana Vortex Qubits and Testing Non-Abelian Statistics, Physical Review Applied, 2019, 12(5), 054035, pp. 1-13.

Machida et al., Zero-Energy Vortex Bound State in the Superconducting Topological Surface State of Fe(Se, Te), Nature Materials, 2019, 18(8):811-815.

Mourik et al., Signatures of Majorana Fermions in Hybrid Superconductor-Semiconductor Nanowire Devices, Science, 2012, 336(6084):1003-1007.

Nayak et al., Non-Abelian Anyons and Topological Quantum Computation, Reviews of Modern Physics, 2008, 80(3):1083-1159.

November et al., Scheme for Majorana Manipulation Using Magnetic Force Microscopy, 2019, arXiv preprint arXiv: 1905.09792, pp. 1-7.

Polshyn et al., Manipulating Multi-Vortex States in Superconducting Structures, arXiv preprint arXiv:1905.06303, pp. 1-14.

Sau et al., Controlling Non-Abelian Statistics of Majorana Fermions in Semiconductor Nanowires, Physical Review B, 2011, 84(9):094505, pp. 1-8.

Straver et al., Controlled Manipulation of Individual Vortices in a Superconductor, Applied Physics Letters, 2008, 93(17): 172514, pp. 1-3.

* cited by examiner

QUANTUM COMPUTING UNIT WITH MAJORANA MODES

CROSS-REFERENCE TO RELATED APPLICATIONS

This application claims the benefit of priority to U.S. Provisional Patent Application No. 63/062,178 filed on Aug. 6, 2020, which is herein incorporated by reference in its entirety.

FIELD OF THE INVENTION

The present invention relates to a quantum computing unit comprising a superconducting substrate, at least three outer Majorana modes, and at least one inner Majorana mode and to a quantum computing array comprising a plurality of these quantum computing units.

BACKGROUND OF THE INVENTION

Quantum computing uses quantum mechanical states and their manipulation as computational elements. Quantum computers have to be contrasted to classical computers. These do not use quantum mechanics and are categorically slower than quantum computers because algorithms can be implemented in quantum computers that scale faster than algorithms on a classical computer. Companies are currently selling quantum computers with a small number of controllable qubits, the quantum analogue of a classical bit. These systems are ordinary quantum computers or computers based on quantum annealing. In addition, a variant of quantum computing, topological quantum computing, that uses topological electronic states of matter may be used. Most notably, it is worked on building a quantum computer based on Majorana zero modes. With these modes, computational gates, called quantum gates, are usually planned to be implemented by moving Majorana zero modes around each other.

Majorana braiding has not been experimentally achieved despite enormous scientific and industrial effort. Implementations in particular face the following problems:

First, Majorana braiding up to now only implements an error free quantum gate if conducted infinitely slow (adiabatically). This is in conflict with a technologically desired fast implementation of computational processes in general and with the necessity to perform quantum computations fast in order to avoid a premature collapse of the quantum state.

Second, when implemented with Majorana vortices, the flux lines of the Abrikosov vortices are twisted when two Majorana zero mode are moved around each other. Subsequent relaxation processes of the vortex lines may affect the quantum computation.

Third, braiding can only implement one quantum gate, the so called braiding gate. For universal quantum computing, i.e., a quantum computer that is able to do all theoretically possible quantum computations, it is necessary to implement other gates as well.

The above-mentioned problems have not been solved in an existing device yet. Yet, theoretical ideas exist for Majorana-based quantum computing that allow for a universal set of gates by using so-called ancilla qubits or realizing special quantum gates by geometric effects. Furthermore, a limit of infinitely slow braiding in a Y-junction of topological insulators is already known. A concept for finite-time Majorana-based computing, where the finite speed of the operation does not introduce systematic errors is, besides the present invention, not known.

The proposed device and mechanism solves the above-mentioned problems. For the simulated material FeTeSe, a perfect implementation of the quantum gates is possible for frequencies up to several GHz. Because the mechanism avoids actual braiding, the vortex lines are not twisted and a relaxation of vortex lines is not happening. By choosing the path of the central Majorana zero mode, a complete set of quantum gates for Majorana-based quantum computing can be implemented. In particular, the braiding gate, the π/8 phase gate, which is also called the magic gate, and the CNOT gate.

The following list gives an overview of publications that may be relevant for the subject matter of the present invention:

[1] T. Posske, C.-K. Chiu, and M. Thorwart, arXiv e-prints, arXiv:1908.03576v1 (2019), arXiv:1908.03576v1 [cond-mat.supr-con].

[2] T. Posske, C.-K. Chiu, and M. Thorwart, arXiv e-prints, arXiv:1908.03576 (2019), arXiv:1908.03576 [cond-mat.supr-con].

[3] F. Arute, K. Arya, R. Babbush, D. Bacon, J. Bardin, R. Barends, R. Biswas, S. Boixo, F. Brandao, D. Buell, B. Burkett, Y. Chen, J. Chen, B. Chiaro, R. Collins, W. Courtney, A. Dunsworth, E. Farhi, B. Foxen, A. Fowler, C. M. Gidney, M. Giustina, R. Graff, K. Guerin, S. Habegger, M. Harrigan, M. Hartmann, A. Ho, M. R. Hoffmann, T. Huang, T. Humble, S. Isakov, E. Jeffrey, Z. Jiang, D. Kafri, K. Kechedzhi, J. Kelly, P. Klimov, S. Knysh, A. Korotkov, F. Kostritsa, D. Landhuis, M. Lindmark, E. Lucero, D. Lyakh, S. Mandr, J. R. McClean, M. McEwen, A. Megrant, X. Mi, K. Michielsen, M. Mohseni, J. Mutus, O. Naaman, M. Neeley, C. Neill, M. Y. Niu, E. Ostby, A. Petukhov, J. Platt, C. *Quintana*, E. G. Rieffel, P. Roushan, N. Rubin, D. Sank, K. J. Satzinger, V. Smelyanskiy, K. J. Sung, M. Trevithick, A. Vainsencher, B. Villalonga, T. White, Z. J. Yao, P. Yeh, A. Zalcman, H. Neven, and J. Martinis, Nature 574, 505510 (2019).

[4] C. Nayak, S. H. Simon, A. Stern, M. Freedman, and S. Das Sarma, Rev. Mod. Phys. 80, 1083 (2008).

[5] A. Y. Kitaev, Physics Uspekhi 44, 131 (2001).

[6] J. Alicea, Y. Oreg, G. Refael, F. von Oppen, and M. P. A. Fisher, Nat. Phys. 7, 412 (2011).

[7] S. R. Elliott and M. Franz, Rev. Mod. Phys. 87, 137 (2015).

[8] V. Mourik, K. Zuo, S. M. Frolov, S. R. Plissard, E. P. A. M. Bakkers, and L. P. Kouwenhoven, Science 336, 1003 (2012).

[9] A. Das, Y. Ronen, Y. Most, Y. Oreg, M. Heiblum, and H. Shtrikman, Nat. Phys. 8, 887 (2012).

[10] T. Machida, Y. Sun, S. Pyon, S. Takeda, Y. Kohsaka, T. Hanaguri, T. Sasagawa, and T. Tamegai, Nature Materials (2019), 10.1038/s41563-019-0397-1.

[11] E. W. J. Straver, J. E. Hoffman, O. M. Auslaender, D. Rugar, and K. A. Moler, Appl. Phys. Lett. 93, 172514 (2008).

[12] B. H. November, J. D. Sau, J. R. Williams, and J. E. Hoffman, arXiv e-prints, arXiv:1905.09792 (2019), arXiv:1905.09792.

[13] H. Polshyn, T. Naibert, and R. Budakian, arXiv e-prints, arXiv:1905.06303 (2019), arXiv:1905.06303.

[14] J.-Y. Ge, V. N. Gladilin, J. Tempere, C. Xue, J. T. Devreese, J. van de Vondel, Y. Zhou, and V. V. Moshchalkov, Nat. Comm. 7, 13880 (2016).

[15] C.-X. Liu, D. E. Liu, F.-C. Zhang, and C.-K. Chiu, Phys. Rev. Applied 12, 054035 (2019).
[16] T. Karzig, Y. Oreg, G. Refael, and M. H. Freedman, Phys. Rev. B 99, 144521 (2019).
[17] T. Karzig, Y. Oreg, G. Refael, and M. H. Freedman, Phys. Rev. X 6, 031019 (2016).
[18] J. D. Sau, D. J. Clarke, and S. Tewari, Phys. Rev. B 84, 094505 (2011).
[19] T. Posske, C.-K. Chiu, and M. Thorwart, arXiv e-prints, arXiv:1908.03576v2 (2020), arXiv:1908.03576v2 [cond-mat.supr-con].
[20] C.-K. Chiu, T. Machida, Y. Huang, T. Hanaguri, F.-C. Zhang, Science Advances Vol. 6, no. 9, eaay0443 (2020).

The above-mentioned publications [1] to [20], and in particular the publications of Refs. [1, 2, 15, 19, 20], are herein incorporated by reference in their entirety. The given references are not exhaustive.

The inventors of the present invention have thus found that it would be advantageous to have an improved quantum computing unit comprising a superconducting substrate, at least three outer Majorana modes, and at least one inner Majorana mode.

SUMMARY OF THE INVENTION

It is an object of the present invention to provide a quantum computing unit comprising a superconducting substrate, at least three outer Majorana modes, and at least one inner Majorana mode that works with reduced systematic errors and in a finite time. The object of the present invention is solved by the subject matter of the independent claims, wherein further embodiments are incorporated in the dependent claims.

The described embodiments similarly pertain to the quantum computing unit comprising a superconducting substrate, at least three outer Majorana modes, and at least one inner Majorana mode and to the quantum computing array comprising a plurality of these quantum computing units. Synergistic effects may arise from different combinations of the embodiments although they might not be described in detail.

Further on, it shall be noted that all embodiments of the present invention concerning a method might be carried out with the order of the steps as described, nevertheless this has not to be the only and essential order of the steps of the method. The herein presented methods can be carried out with another order of the disclosed steps or with leaving out optional steps without departing from the respective method embodiment, unless explicitly mentioned to the contrary hereinafter.

According to an aspect of the invention, there is provided a quantum computing unit comprising a superconducting substrate or otherwise superconducting component, at least three outer Majorana modes, and at least one inner Majorana mode, wherein the at least three outer Majorana modes are located along an outer perimeter, and wherein the at least one inner Majorana mode is located on or in the close vicinity of the superconducting substrate or component within the outer perimeter.

The superconducting substrate does not need to be superconducting at every position of the substrate. It may be sufficient, when only portions of the substrate are superconducting, or when the substrate comprises another component connected to the substrate which may be superconducting. Thus, only the portions of the substrate may be superconducting, which are close to the position of the Majorana modes, that are located at least in close vicinity of the superconducting portions of the substrate or the other component. At least in close vicinity may be understood as being located on the substrate, or being located spatially nearby or on top of the substrate. The Majorana modes can be located proximal to the substrate. In addition, the substrate may be understood as substrate as such, or alternatively as an at least partially superconducting layer on top of another substrate.

In this aspect of the invention, a mechanism and a device how to realize a universal set of gates for quantum computing with Majorana zero modes are proposed. Opposed to other procedures, the mechanism works in principle without systematic errors and in a finite time up to the GHz-range. Majorana modes are electronic low-energy quasiparticles in superconducting systems, which carry a nonabelian anyonic statistics, and which have only recently been experimentally detected. To realize the invention, four Majorana modes are placed in a special geometry. Three outer Majorana modes are placed on a triangle and a fourth, inner Majorana mode is moved on a defined path close to the center of the triangle in a defined time.

The application covers the following parts: Creation of the device and the structure; the braiding gate, the $\pi/8$ phase gate, and the $\pi/12$ phase gate; a scalable quantum computing scheme; and the CNOT gate.

First, it is proposed how to construct the setup of a quantum computing unit according to the invention. Vortex Majoranas on the surface of FeTe0.55Se0.45 may be used. However, the mechanism works for all material systems that carry Majorana zero modes in the middle of Abrikosov vortices. In the low-field regime of up to 1 T, the arrangement of the vortices may be close to a triangular lattice, where the strength of the magnetic field controls the lattice constant as demonstrated by previous theoretical research. For the setup of this first aspect of the invention, the tight-binding model predicts an ideal edge length of the triangle of r6=77.3 nm, corresponding to a magnetic field of 0.36 T. The concrete value for the device is obtained by calibration relative to this starting point. A deviation of about 0.1 nm from the perfect positions does not crucially affect the protocol. Next, a technique to drag vortices is used, preferably based on scanning tunneling microscopy or magnetic force microscopy, to move the inner vortex $\gamma m$ to the center of one Majorana triangle ($\gamma 1$, $\gamma 2$, $\gamma 3$) and to isolate this formation by moving surrounding vortices away. Finally, the positions of these four vortices are precisely adjusted such that only two zero-bias tunneling peaks appear at the positions of $\gamma 1$ and $\gamma 3$, while a small energy splitting of about 25 $\mu eV$ is present at $\gamma 2$ and $\gamma m$. Because of this energy splitting, a temperature below 0.3 K for quantum information processing is assumed, which is achieved in state-of-the-art experiments. Once the perfect distances are revealed by this calibration procedure, a surface pattern or layer can be defined by litographic methods in form of a second superconducting layer on top of the substrate that may create the desired vortex configuration without the need of a dragging the vortices into the right position.

In order to realize the braiding gate, the $\pi/8$ phase gate and the $\pi/12$ phase gate, the central vortex Majorana has to be moved on defined paths in a defined time. To this end, different paths of the inner Majorana mode within the triangle formed by the three outer Majorana modes may be used. For concreteness, it is concentrated on the explanation how the braiding gate can be realized; the $\pi/8$ phase gate and the $\pi/12$ phase gate can be realized by changing the path of the inner Majorana mode accordingly.

For a scalable scheme for quantum computation, a quantum computing array is needed, as single gate operations do not result in a quantum computer. For this, several qubits must be coupled. This can be achieved by extending the triangular structure introduced above on the plane by either placing the vortices individually with the techniques mentioned above or by a dedicated surface layer or other position-defining structure. The single qubits of the triangular structures may be combined by a hexagram configuration.

A CNOT gate can be realized by a series or sequence of seven braiding gates. Thus, together with the braiding gate and the $\pi/8$ phase gate of the individual triangular structures, universal quantum computing can be realized.

According to another aspect of the invention, there is provided a quantum computing unit comprising a superconducting substrate, at least three outer Majorana modes, and at least one inner Majorana mode, wherein the at least three outer Majorana modes are on one-dimensional topological superconductors (Majorana wires) or networks thereof and/or spatially separated from the superconducting substrate or superconducting component and located along an outer perimeter, and wherein the at least one inner Majorana mode is located on the superconducting substrate within the outer perimeter. The network of superconducting wires can be formed in a Y-shape, wherein the inner Majorana mode is located in the center of the Y-shape. Also single superconducting wires can be used that are not connected to a network.

In an embodiment of the invention, the at least three outer Majorana modes are located on the superconducting substrate or superconducting component along the outer perimeter.

In an embodiment of the invention, the quantum computing unit further comprises a network of one-dimensional topological superconductors, which can be, for example, Majorana wires, Majorana atomic chains, and similar materials, wherein the at least three outer Majorana modes are located along the outer perimeter on the one-dimensional topological superconductors, like Majorana wires, Majorana atomic chains, etc. and spatially separated from the superconducting substrate.

In an embodiment of the invention, the at least three outer Majorana modes are equidistantly arranged.

In an embodiment of the invention, one Majorana mode is located within an equilateral triangle which is formed by three Majorana modes out of the plurality of outer Majorana modes.

In an embodiment of the invention, a center of the inner Majorana mode is arranged in the center of a circular outer perimeter.

In an embodiment of the invention, the outer Majorana modes and the inner Majorana mode are moved relative to each other such that the inner Majorana mode moves relatively to the outer Majorana modes virtually (regarding the couplings of pairs of Majorana modes) or in reality along a defined path close to the center of the outer perimeter.

In an embodiment of the invention, the inner Majorana mode moves relative to the outer Majorana modes along a defined path close to the center of the outer perimeter in a defined time. The movement of the inner Majorana mode relative to the outer Majorana modes can be a real motion of the inner Majorana mode with respect to the outer Majorana modes, or it can be a virtual motion of the inner Majorana mode, where the entirety of the outer Majorana modes are moved relative to the inner Majorana mode, and the inner Majorana mode may be spatially fixed.

In an embodiment of the invention, the outer Majorana modes and the inner Majorana mode are moved relative to each other along a defined path non-adiabatically in a defined finite time, preferably with a frequency of up to several 1 GHz.

Non-adiabatically may be understood in that the movement is so fast that in principle excitations away from the ground state can happen in the system. This can be done by the electric gates mentioned in the application and, probably, by fast vibrating/moving scanning tunneling microscopy tips and atomic force microscopy cantilevers.

In an embodiment of the invention, the defined path is approximately along arcs of circles with defined radii that connect corners of an equilateral triangle within the outer perimeter of the outer Majorana modes.

In an embodiment of the invention, the defined path is approximately along a symmetrical half of an outer contour formed by arcs of circles with defined radii that connect corners of an equilateral triangle.

In an embodiment of the invention, the defined path is approximately along a symmetrical third of an outer contour formed by arcs of circles with defined radii that connect corners of an equilateral triangle.

In an embodiment of the invention, the movement of the inner Majorana mode relative to the outer Majorana modes along the defined path changes a distance of the inner Majorana mode to at least one of the outer Majorana modes, wherein the change of the distance results in a change of hybridization of the inner Majorana mode with the at least one of the outer Majorana modes.

In an embodiment of the invention, a material of the first superconducting substrate is $FeTe_xSe_{1-x}$.

In an embodiment of the invention, a material of the first superconducting substrate is $FeTe_{0.55}Se_{0.45}$.

In an embodiment of the invention, a motion of the inner Majorana mode relative to the superconducting substrate is caused by the tip of a scanning tunneling microscope or the cantilever of an atomic force microscope.

In an embodiment of the invention, a motion of the outer Majorana modes relative to the superconducting substrate is caused by applying an electric field.

In an embodiment of the invention, a hybridization of a pair of Majorana modes is altered by changing the size of Majorana modes and/or manipulating an area in-between a pair of Majorana modes with electromagnetic fields or magnetic and nonmagnetic adatoms.

In an embodiment of the invention, a hybridization of a pair of Majorana modes is altered by changing the size of Majorana modes and/or manipulating an area in-between a pair of Majorana modes with electromagnetic fields or magnetic and nonmagnetic adatoms.

In an embodiment of the invention, the execution of a gate in the quantum computing unit operates without measurements, in particular so called ancilla bit measurements, of a state of the quantum computing unit.

A quantum computing unit finally needs to read out the data (i.e., measure). However, single gates may work without reading out data (ancilla measurements), which is a major gain in speed.

In an embodiment of the invention, the outer Majorana modes and the inner Majorana mode are moved relative to each other along a defined path non-adiabatically in a defined finite time, and the execution of a gate in the quantum computing unit operates without measurements, in particular so called ancilla bit measurements, of a state of the quantum computing unit.

According to another aspect of the invention, there is provided a quantum computing array comprising a plurality of quantum computing units according to any of the previous embodiments.

In an embodiment of the invention, the superconducting substrate of each of the quantum computing units forming the plurality of quantum computing units is a common superconducting substrate so that the outer Majorana modes and the inner Majorana modes of the respective quantum computing units are arranged with respect to the same superconducting substrate.

If other superconducting components like islands or shells are used instead of the superconducting substrate, the superconductor does not necessarily connect the individual units.

In an embodiment of the invention, adjacent quantum computing units share a common outer Majorana mode.

In an embodiment of the invention, each two of the outer Majorana modes of three quantum computing units out of the plurality of quantum computing units are arranged in a hexagon.

In an embodiment of the invention, the outer Majorana modes of the plurality of quantum computing units are arranged in a pattern corresponding to medians/centers of sides of a honey comb structure (hexagram configuration, see FIG. 1c).

In an embodiment of the invention, the quantum computing array of any of the previous embodiments further comprises a second superconducting material grown onto the common superconducting substrate, wherein the second superconducting material has formed a grove mesh thereon, wherein the grove mesh surrounds islands of the second superconducting material, and wherein the outer Majorana modes are arranged with respect to the superconducting substrate layer in the center of groves of the grove mesh of the second superconducting material.

In an embodiment of the invention, the islands have concave bays opposite the respective outer Majorana modes forming a cage for maintaining the location of the respective outer Majorana modes.

In an embodiment of the invention, centers of the inner Majorana modes are located at nodes of the grove mesh.

In an embodiment of the invention, the islands have concave bays opposite the respective inner Majorana modes forming a cage for limiting a motion range of the respective inner Majorana modes.

In an embodiment of the invention, a material of the second superconducting material is a material having a higher critical superconducting temperature than the operating temperature of the quantum computing array.

Thus, the benefits provided by any of the above aspects equally apply to all of the other aspects and vice versa.

In a gist, the invention relates to a quantum computing unit comprising a superconducting substrate or other superconducting component, at least three outer Majorana modes, and at least one inner Majorana mode, wherein the at least three outer Majorana modes are located along an outer perimeter, and wherein the at least one inner Majorana mode is located within the outer perimeter. This spatial configuration of the four participating Majorana modes allows to control the time-dependent coupling between the respective Majorana modes. The related quantum gates can be performed perfectly in a finite time, preferably with a frequency of up to several GHz. These include the braiding gate, the $\pi/8$ magic phase gate, the $\pi/12$ phase gate, and, for multi-qubit systems, the CNOT gate. The robustness of the mechanism guarantees that for special times the quantum gate is conducted the quantum gate is perfectly realized. This property is independent of material specific parameters. Hence, the behavior can be expected in all systems where Majorana zero modes appear in the center of Abrikosov vortices, in particular, not only in FeTeSe, which we consider as an example.

The above aspects and embodiments will become apparent from and be elucidated with reference to the exemplary embodiments described hereinafter. Exemplary embodiments of the invention will be described in the following with reference to the following drawings:

DETAILED DESCRIPTION OF EMBODIMENTS

Figure 1A:
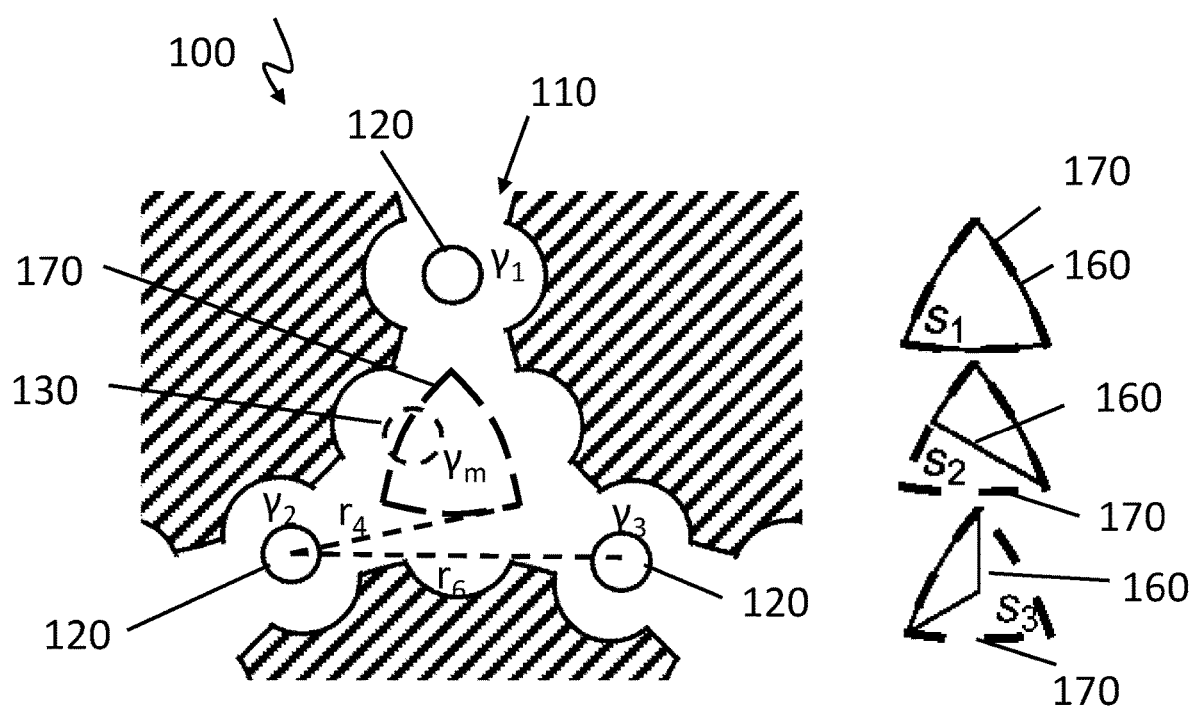
FIG. 1a shows a quantum computing unit according to an embodiment of the invention and the paths s1, s2, and s3 to realize the braiding gate, the $\pi/8$, and the $\pi/12$ gate.

FIG. 1a shows a quantum computing unit 100 according to an embodiment of the invention. A setup for finite-time Majorana braiding with Abrikosov vortices on FeTeSe is shown. Three vortex Majoranas 120 ($\gamma_1$, $\gamma_2$, $\gamma_3$) are placed at the edges of an equilateral triangle 170 such that the coupling between them vanishes. A fourth, movable vortex Majorana 130 ($\gamma_4$) is placed close to the center. The three decoupled vortex Majoranas $\gamma_1$, $\gamma_2$, $\gamma_3$ are $r_6$ away from each other. The fourth, movable vortex Majorana $\gamma_m$ is on a path that is $r_4$ away from the exterior one. Moving the central vortex Majorana 130 on a defined path 160 within a defined time realizes quantum gates on the degenerate ground state. The first path s1 shown on the right realizes the braiding gate, while the second path s2 realizes the $\pi/8$ phase gate (also called magic gate). The third path s3 realizes the $\pi/12$ phase gate. The hatched area is a surface layer that facilitates the correct positioning of the vortices.

In order to realize the braiding gate, the $\pi/8$ phase gate and the $\pi/12$ phase gate, the central vortex Majorana has to be moved on defined paths in a defined time. To this end, different paths of the inner Majorana mode within the triangle formed by the three outer Majorana modes may be used. For concreteness, it is concentrated on the explanation how the braiding gate can be realized; the π/8 phase gate and the π/12 phase gate can be realized by changing the path of the inner Majorana mode accordingly as shown in FIG. 1a.

In an embodiment of the invention, the defined path is approximately along arcs of circles with defined radii that connect corners of an equilateral triangle within the outer perimeter of the outer Majorana modes as shown in FIG. 1a.

In an embodiment of the invention, the defined path is approximately along a symmetrical half of an outer contour formed by arcs of circles with defined radii that connect corners of an equilateral triangle as shown in FIG. 1a.

In an embodiment of the invention, the defined path is approximately along a symmetrical third of an outer contour formed by arcs of circles with defined radii that connect corners of an equilateral triangle as shown in FIG. 1a.

Figure 1B:
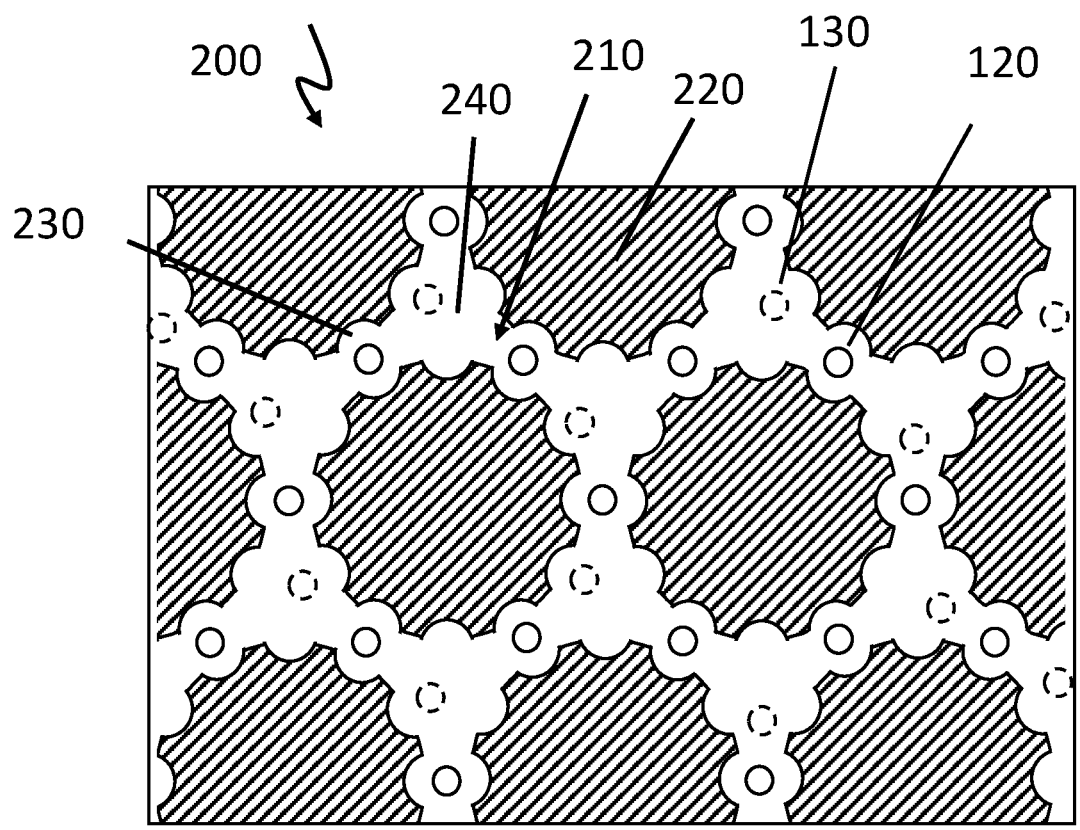
FIG. 1b shows a quantum computing array according to another embodiment of the invention as well as the described grove mesh.
Figure 6:
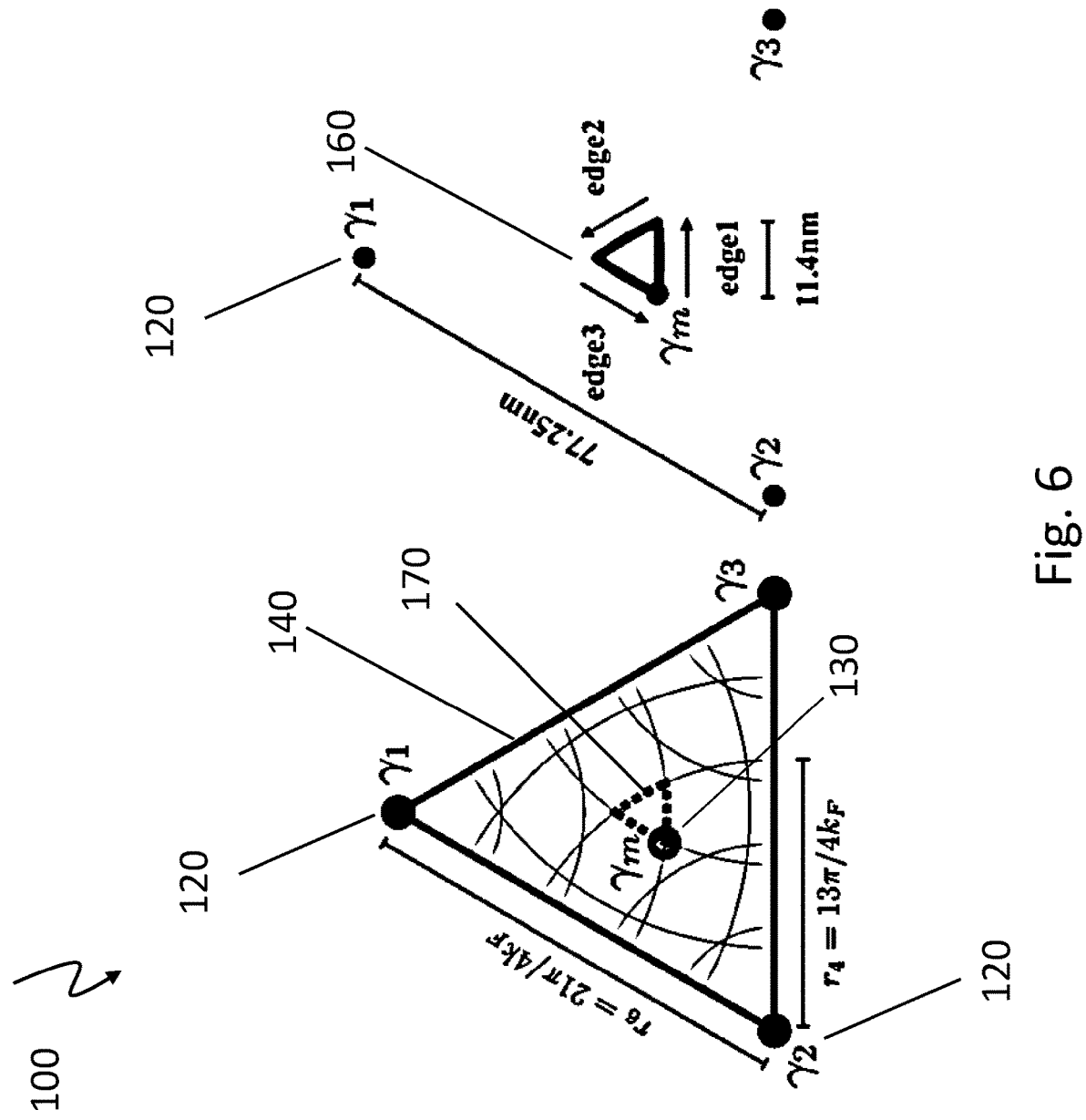
FIG. 6 shows the vortex Majorana configuration in real scale for the braiding scheme in the continuous model (left) and the tight-binding model (right) on FeTeSe.

FIG. 6 shows the arrangement of the three outer Majorana modes 120 along an outer perimeter 140 and three versions of a defined path 160 of the inner Majorana mode 130 according to an embodiment of the invention and a scheme of the triangular structure. The decoupling distances are chosen such that the vortex Majoranas 120, 130 decouple. For FeTeSe, the distance between the exterior vortex Majoranas 120 may be 77.3 nm FIG. 1b shows a quantum computing array 200 according to another embodiment of the invention. Concatenation of triangular structures in 2D in a hexagram pattern leads to a scalable scheme for Majorana-based quantum computing as quantum computing array 200. Each two of the outer Majorana modes 120 of three quantum computing units 100 out of the plurality of quantum computing units 100 are arranged in a hexagon. The outer Majorana modes 120 of the plurality of quantum computing units 100 can be arranged in a pattern corresponding to medians/centers of sides of a honey comb structure (hexagram configuration). The array can further comprise a second superconducting material grown onto the common superconducting substrate 110, wherein the second superconducting material has formed a grove mesh 210 thereon, wherein the grove mesh 210 surrounds islands of the second superconducting material 220, wherein the outer Majorana modes are arranged with respect to the superconducting substrate layer in the center of groves of the grove mesh 210 of the second superconducting material. The islands have concave bays 230 opposite the respective outer Majorana modes 120 forming a cage for maintaining the location of the respective outer Majorana modes 120. The centers of the inner Majorana modes 130 are located at nodes of the grove mesh 210.

Figure 1C:
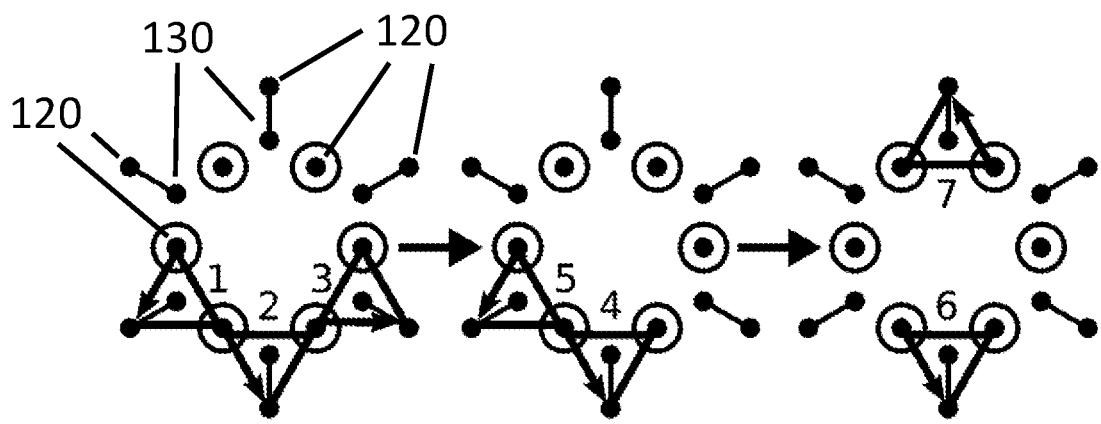
FIG. 1c shows a realization of a CNOT gate with the quantum computing array according to the invention.

FIG. 1c shows a realization of a CNOT gate with the quantum computing array 200 according to the invention. The inner Majorana modes corresponding to the outer Majorana modes forming the hexagon are manipulated in seven consecutive processes of claim 5 to realize a CNOT quantum gate, where the first manipulation can be chosen freely (position 1), the second manipulation at a neighboring inner Majorana (position 2), the third manipulation at the next neighbor in the same direction (position 3), the fourth manipulation at positon 2, the fifth manipulation at position 1 and the sixth and seventh manipulation at position 2 and the opposite position of position 2. The last two steps can be conducted in any order. An example of the order is shown in FIG. 1c.

In general, the CNOT gate can also be formed by seven consecutive braiding gates: The first inner Majorana can be chosen freely (position 1), the second manipulation happens at a neighboring inner Majorana (position 2), the third manipulation at the next neighbor in the same direction (position 3), the fourth manipulation at position 2, the fifth manipulation at position 1, and the sixth and seventh manipulation at position 2 and the opposite position of position 2. The last two steps can be conducted in any order.

Figure 2A:
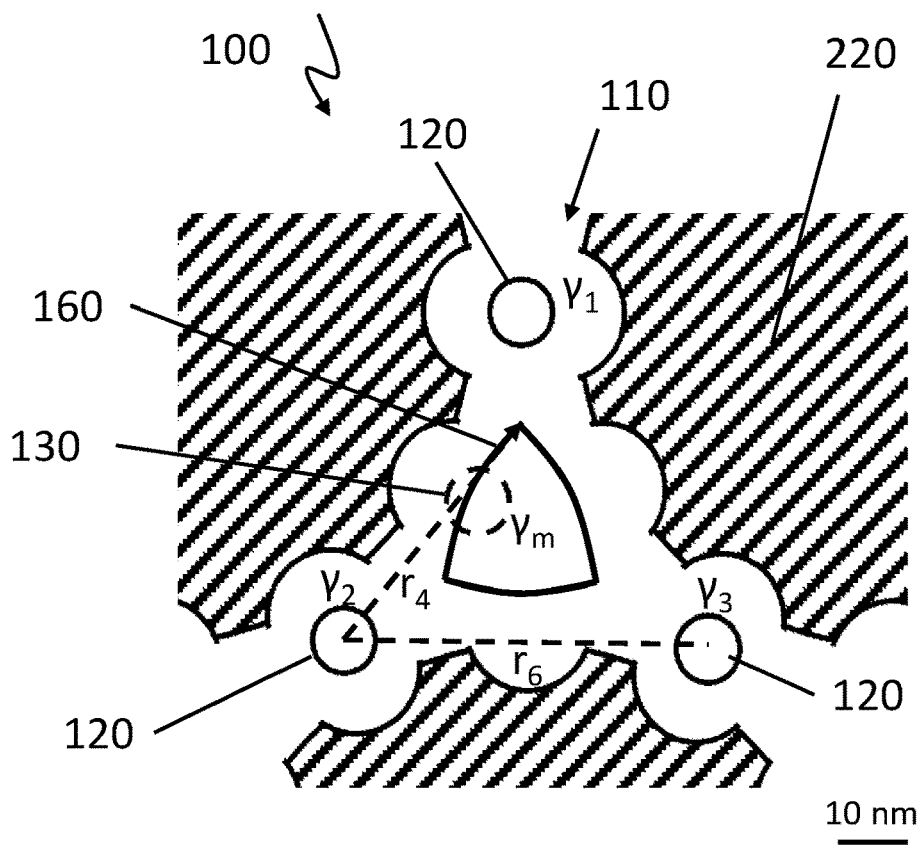
FIGS. 2a, 2b, and 2c show the realization of the braiding gate with a quantum computing unit according to an embodiment of the invention.
Figure 2B:
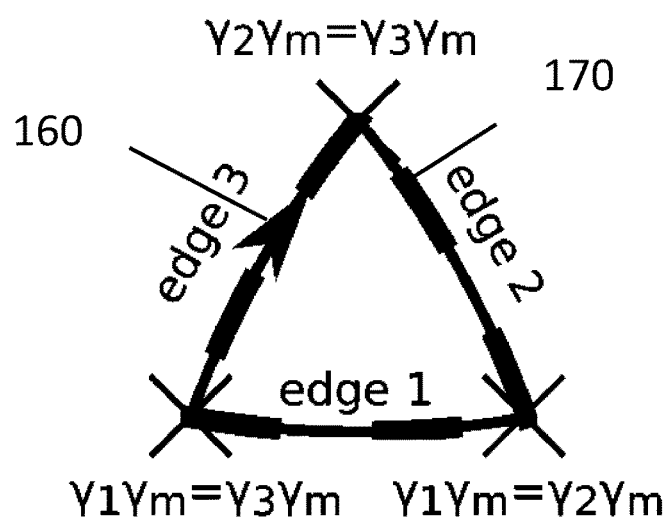
Figure 2C:
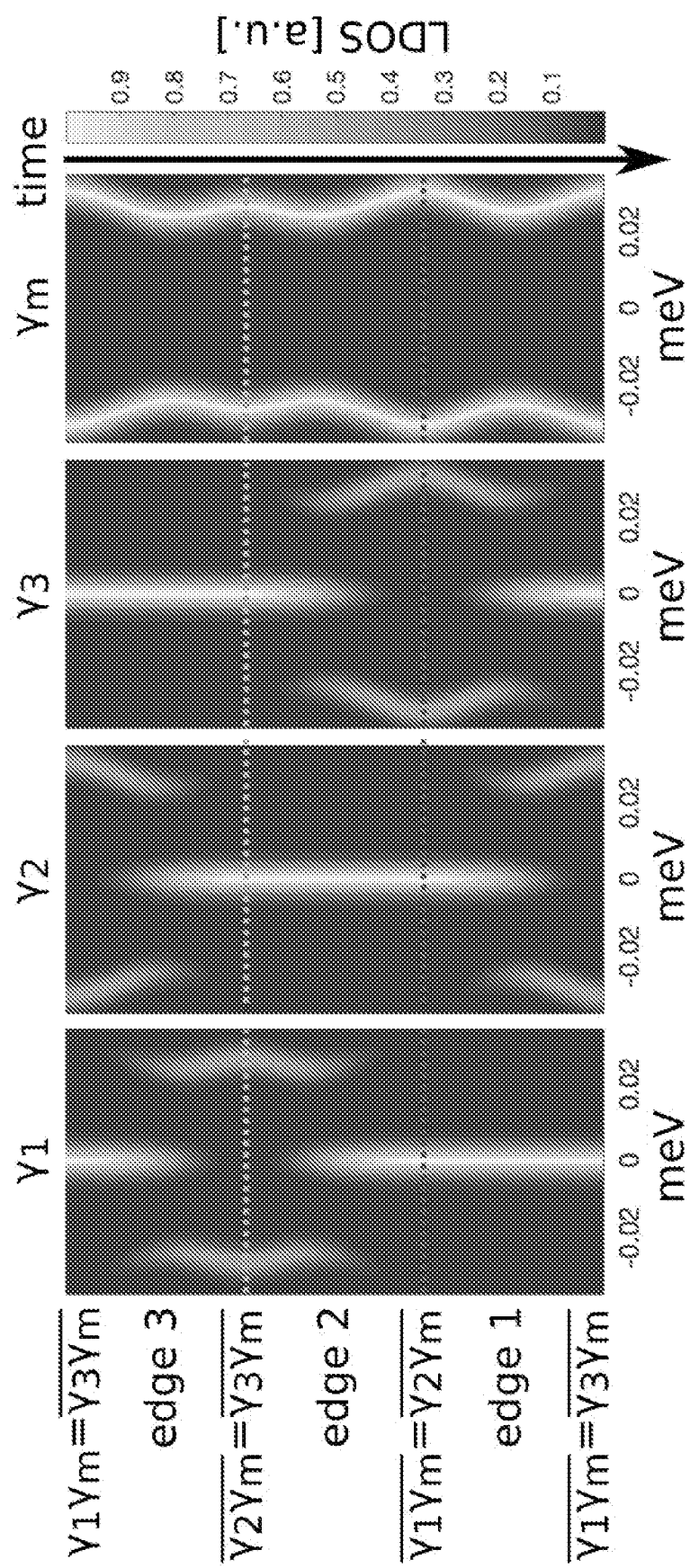

FIGS. 2a, 2b, and 2c show the realization of the braiding gate with a quantum computing unit 100 according to an embodiment of the invention. The braiding path shown in FIGS. 2a and 2b is calibrated by ensuring that the local density of states (LDOS) for each vortex Majorana 120, 130 during the braiding process qualitatively aligns with the results shown in FIG. 2c. Hence, at the beginning, only $\gamma_2$ and $\gamma_m$ hybridize so that $\gamma_1$ and $\gamma_3$ exhibit zero-bias peaks. Furthermore, $\gamma_3$ always possesses a zero-bias peak during the first third of the braiding protocol. When $\gamma_m$ moves towards $\gamma_1$, the energy splitting starts to transit from $\gamma_2$ to $\gamma_1$. The zero-bias peaks eventually appear at $\gamma_2$ and $\gamma_3$ when $\gamma_m$ is closest to $\gamma_1$. In the remaining two thirds of the braiding path, the LDOS evolves as in the first third, but with suitably permuted indices of the vortex Majoranas 120, 130, see FIG. 2c. Importantly, two vortex Majoranas remain at zero energy throughout the whole braiding process. Furthermore, the energy splitting transits from $\gamma_2$ to $\gamma_m$ and then back to $\gamma_3$. On the other hand, the LDOS of $\gamma_m$ never possesses any zero-bias peak, as shown in FIG. 2c, since it always couples to another vortex Majorana. Observing the LDOS evolution for each vortex is the primary step to check successful braiding.

To replace the technically demanding simultaneous measurement of the LDOS at each vortex, first the LDOS at each vortex can be probed by an STM and then the central vortex $\gamma_m$ is moved a short step along the braiding path. This procedure is iterated along the full braiding path until $\gamma_m$ is back to the starting point.

Next the informational change after braiding has to be confirmed. The important data from the LDOS measurement to this end are the energy splitting and the peak heights of the vortex Majoranas that have been collected in the previous step, see FIG. 1. From the energy splittings, a low-energy model can be derived that determines the quantum gate operation on the degenerate ground state and its quality. The model is explained in greater detail in Ref. [1]. Braiding is then experimentally realized by moving $\gamma_m$ along the previously saved braiding path without probing any LDOS.

Finally, reading out the change of the quantum state after braiding is an important task. In particular, the Majorana qubit can be read out (FIG. 5c) either by measuring the resonant current in Coulomb blocked systems, where charge fluctuations are suppressed and quantum information is thus protected, or by interferometry. Importantly, Majorana braiding and readout are distinct processes, such that the readout time is not limited to happen on the time scale of the braiding.

The LDOS evolution for each vortex core as the mediating Majorana $\gamma_m$ moves along in the braiding loop is depicted in FIG. 2c. Since the energy splitting stemming from Majorana hybridization is around 25 μeV, the energy resolution of the probe has to be better than this value to distinguish zero-bias peaks and energetically split ones. The diagrams from left to right show the LDOS of the corresponding vortex Majorana. Along this path, two zero-bias peaks are always simultaneously present at two of the three non-mediating vortices (1,2,3), while the mediating Majorana $\gamma_m$ 130 always couples with another vortex Majorana 120 resulting in energy splitting. The LDOS for each vortex does not break particle-hole symmetry significantly, which supports the validity of a low-energy model.

Figure 3:
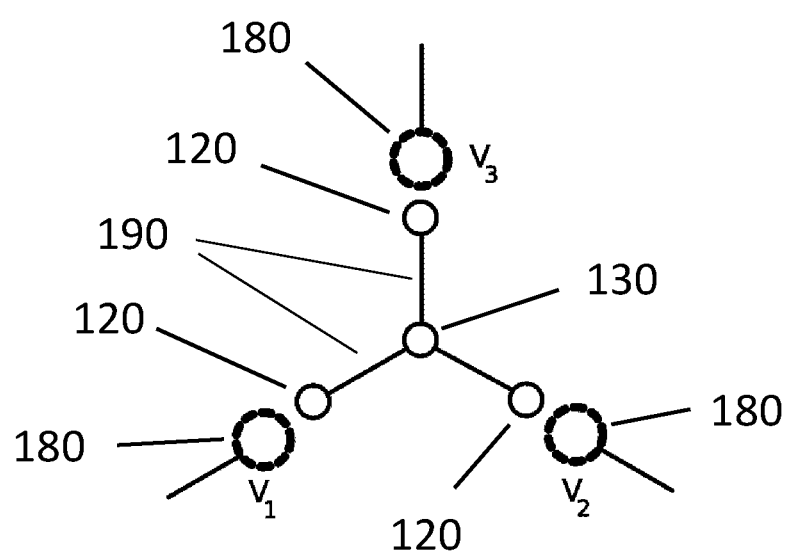
FIG. 3 shows a quantum computing unit according to another embodiment of the invention employing one-dimensional topological superconductors.

FIG. 3 shows a quantum computing unit 100 according to another embodiment of the invention. This embodiment employs a Y-junction of one-dimensional topological superconductors 150 and Majorana peaks 120, 130 therein. Close to the ends of the Y-junction, gates 180 are placed, which shift the end-Majoranas 120 towards the center Majorana 130 in a controlled way. The local density of states can be read out by a scanning tunneling microscope.

While the previous embodiments presented in this invention work with superconducting Aprokosov vortices on superconducting substrates 110 with a superficial Dirac cone, the main industrial platform for Majorana-based quantum computing, however, currently are semiconductor wires with large spin-orbit coupling on an s-wave superconductor. The second aspect of the invention is shown in FIG. 3. This device uses a Y-junction of 1D topological superconductors. These can either be atomic chains or the mentioned semiconducting wires on a superconductor. Instead of moving the central Majorana mode 130 in these structures, which may not be possible, gate contacts 180 are close to the ends of the Y-structure that effectively shift the Majorana end modes 120 towards the center and thereby control the coupling to the central Majorana mode 130 such that virtually the paths shown in FIG. 1a are realized. Readout of the local density of states and calibration may be achieved the same way as for the triangular structure in FIG. 1.

Figure 4A:
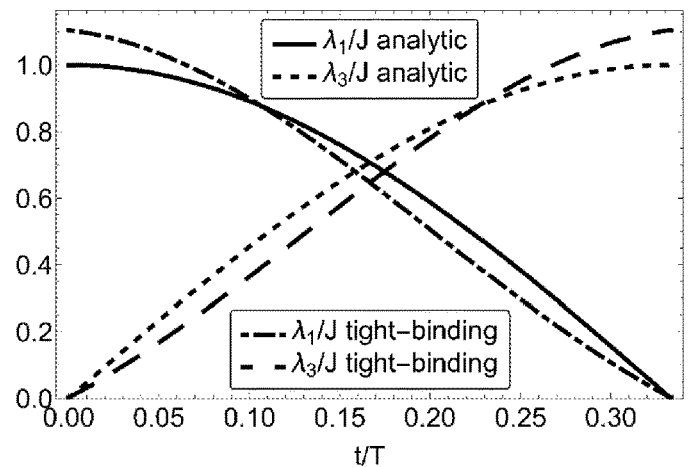
FIGS. 4a, 4b, and 4c show the robustness of the braiding gate realized with a quantum computing unit according to an embodiment of the invention.
Figure 4B:
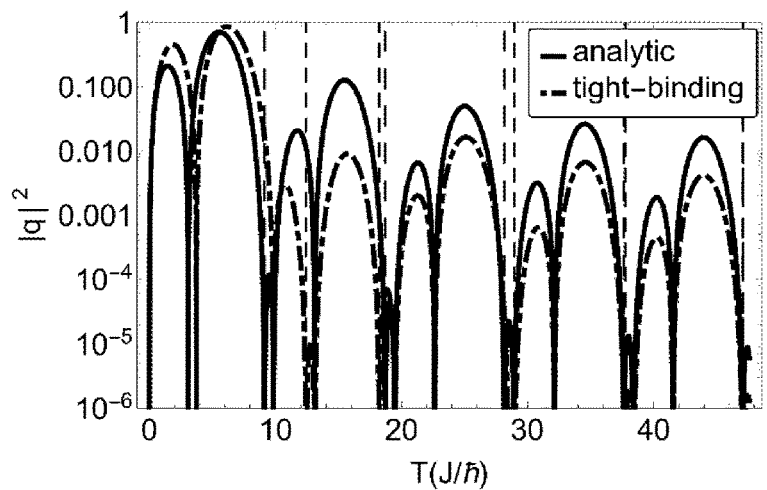
Figure 4C:
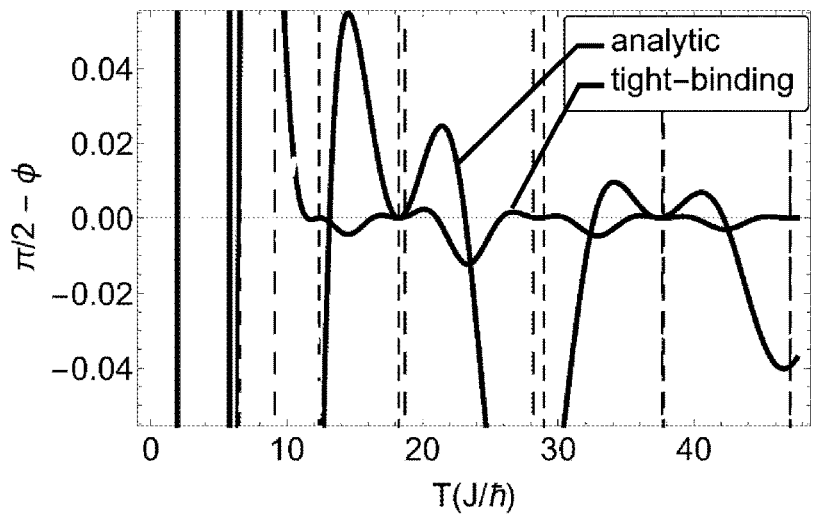

FIGS. 4a, 4b, and 4c show the robustness of the braiding gate realized with a quantum computing unit according to an embodiment of the invention. These are explained in Ref. [1] and [2]. Realistic tight-binding parameters and analytically solvable parameters when $\gamma_m$ is moved along the braiding path in the time T. FIG. 4a shows the hybridization strengths $\lambda_1$ and $\lambda_3$ ($\lambda_2=0$ not shown) during the first third of the braiding process. FIG. 4b shows that unwanted excitations $|q|^2$ vanish around specific times $T_n$ for realistic as well as analytically solvable parameters. The zeros are protected. FIG. 4c shows that when the quasiparticle excitations vanish at dashed lines, the finite-time Berry phase $\varphi$ reaches the perfect adiabatic braiding value of $\pi/2$.

Figure 5A:
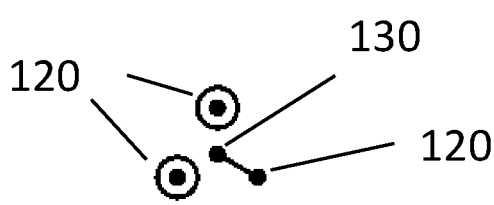
FIGS. 5a, 5b, 5c, and 5d show a multi qubit extension with a quantum computing unit according to an embodiment of the invention.
Figure 5B:
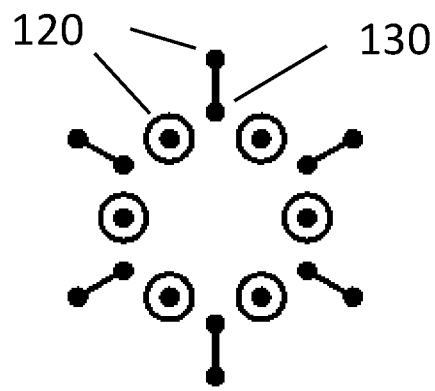
Figure 5C:
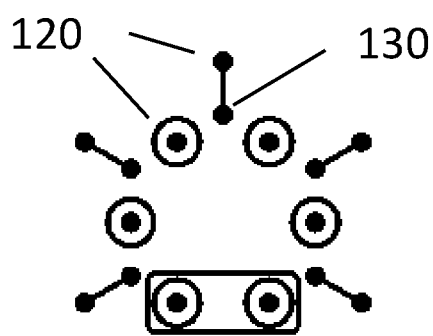
Figure 5D:
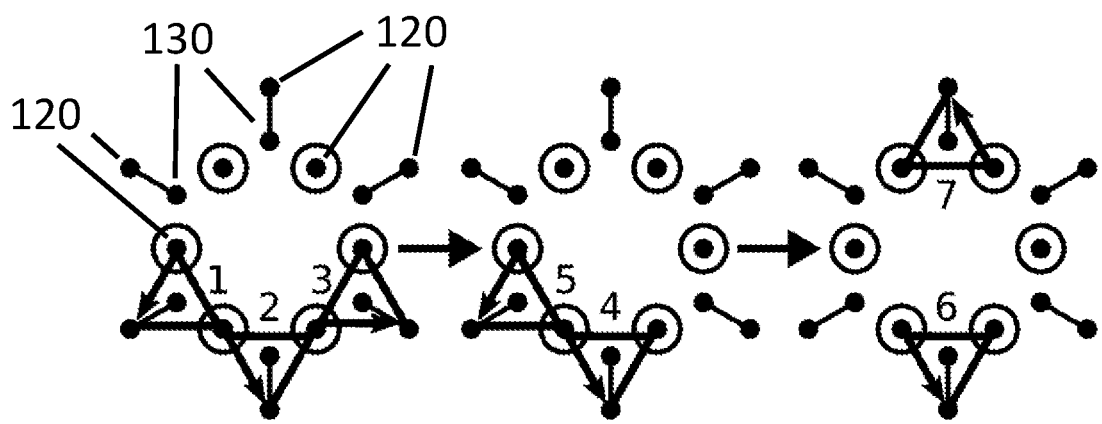

FIGS. 5a, 5b, 5c, and 5d show a multi qubit extension with a quantum computing unit according to an embodiment of the invention. In particular, FIG. 5c shows a hexagram structure altered to measure the information within a qubit, see Refs. [1] and [2]. FIG. 5a shows a scheme of an elementary cell of a quantum computing unit. Lines between interior vortex Majoranas 130 and exterior ones 120 indicate bound Majoranas (gapped out). Free Majoranas are encircled. FIG. 5b shows six elementary cells forming a hexagram. Six free Majoranas remain forming two qubits. FIG. 5c shows that within a readout area (rectangle) two Majoranas can hybridize, enabling the read-out of their state. FIG. 5d shows the application of the CNOT gate. The triangular paths signify the motion of the mediating vortices, numbers gate order.

FIG. 6 shows the vortex Majorana configuration in real scale for the braiding scheme in the continuous model (left) and the tight-binding model (right). The braiding path starts from the vertex between edge 1 and edge 2. The mediating Majorana $\gamma_m$ moves along edge 3 to edge 2 and then to edge 1. Finally, $\gamma_m$ is back to the starting position.

Figure 7A:
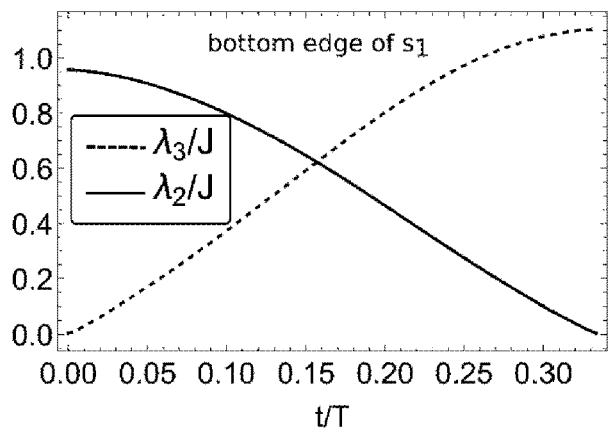
FIGS. 7a, 7b, and 7c show a realistic course of the couplings extracted from the tight-binding model.
Figure 7B:
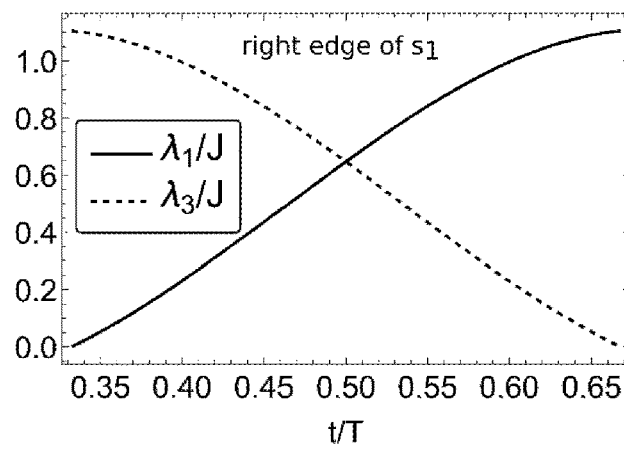
Figure 7C:
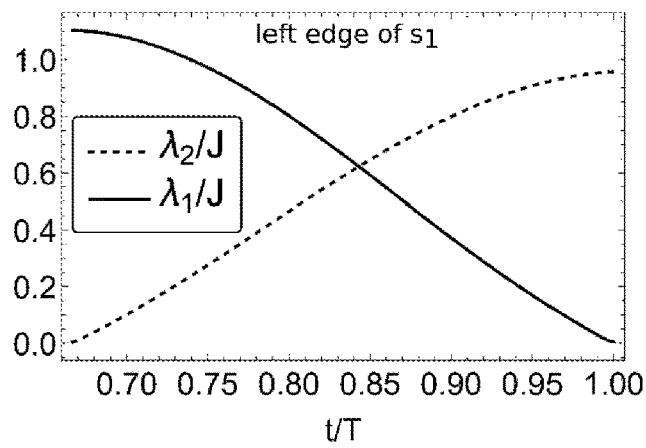

FIGS. 7a, 7b, and 7c show a realistic course of the couplings extracted from the tight-binding model, that artificially breaks the C3 symmetry of the setup in FIG. 1a. In each figure, the skipped coupling constant is close to zero. The mediating vortex Majorana is moved along the edge of the path s1.

Figure 8A:
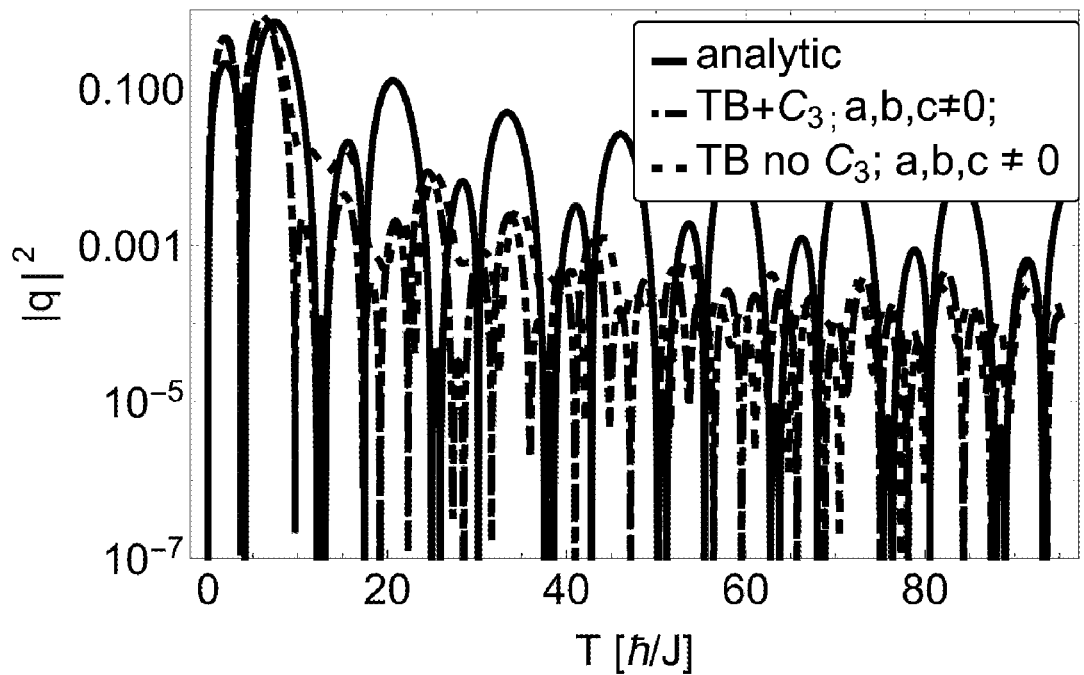
FIGS. 8a and 8b show a realization of a braiding gate with additional residual couplings.
Figure 8B:
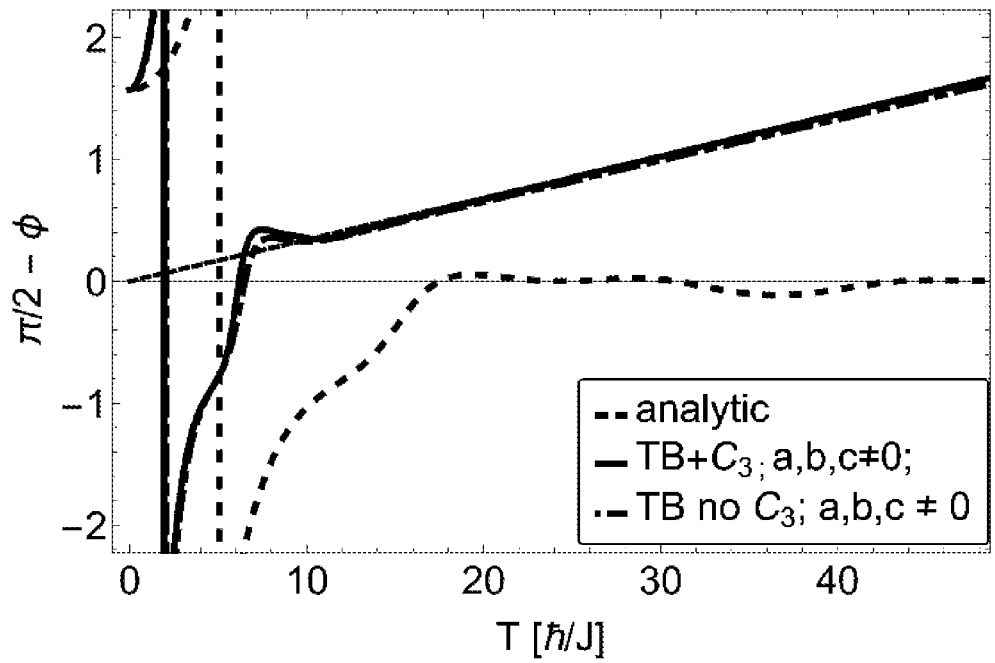

FIGS. 8a and 8b show a realization of a braiding gate with additional residual couplings and a broken C3 symmetry. FIG. 8a shows unwanted quasiparticle excitations $|q|^2$. For a lifted ground state degeneracy (dash-dotted curve) there are still special process times for which the unwanted quasiparticle excitations vanish. Only for an additionally broken C3 symmetry (dashed curve), the formerly protected zeros lift. FIG. 8b shows finite-time Berry phase difference (p. Since the ground state is no longer degenerate, an additional dynamic phase adds to the adiabatic Berry phase of $\pi/2$ (solid and dash-dotted curve). This additional dynamic phase is approximately linear in time (asymptotic line).

Figure 9A:
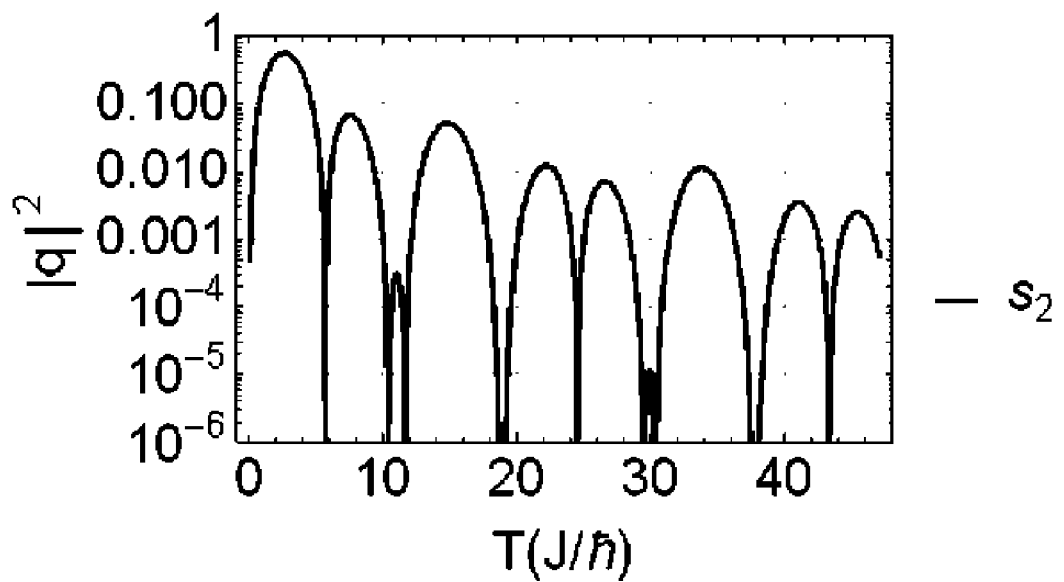
FIGS. 9a and 9b show properties of a $\pi/8$ phase gate.
Figure 9B:
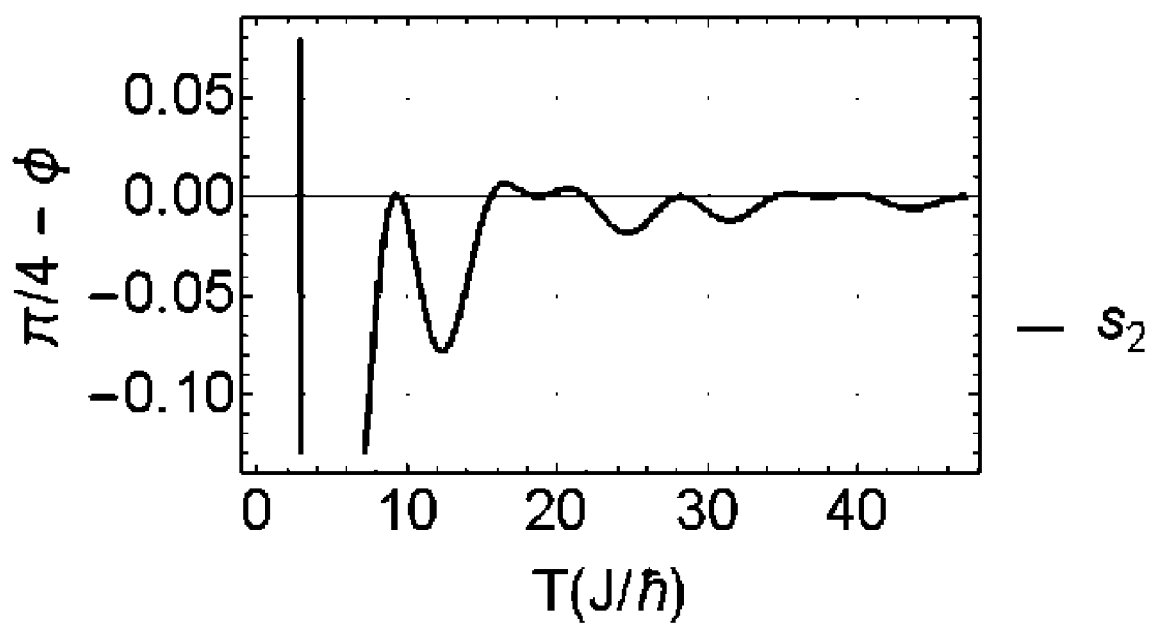

FIGS. 9a and 9b show properties of a $\pi/8$ phase gate (magic gate), which is obtained by moving the mediating Majorana $\gamma_m$ along the path s2 of FIG. 1. FIG. 9a shows unwanted quasiparticle excitations $|q|^2$.

FIG. 9b shows Berry phase difference p. For each fifth zero of q, $\varphi$ vanishes as well.

Figure 10:
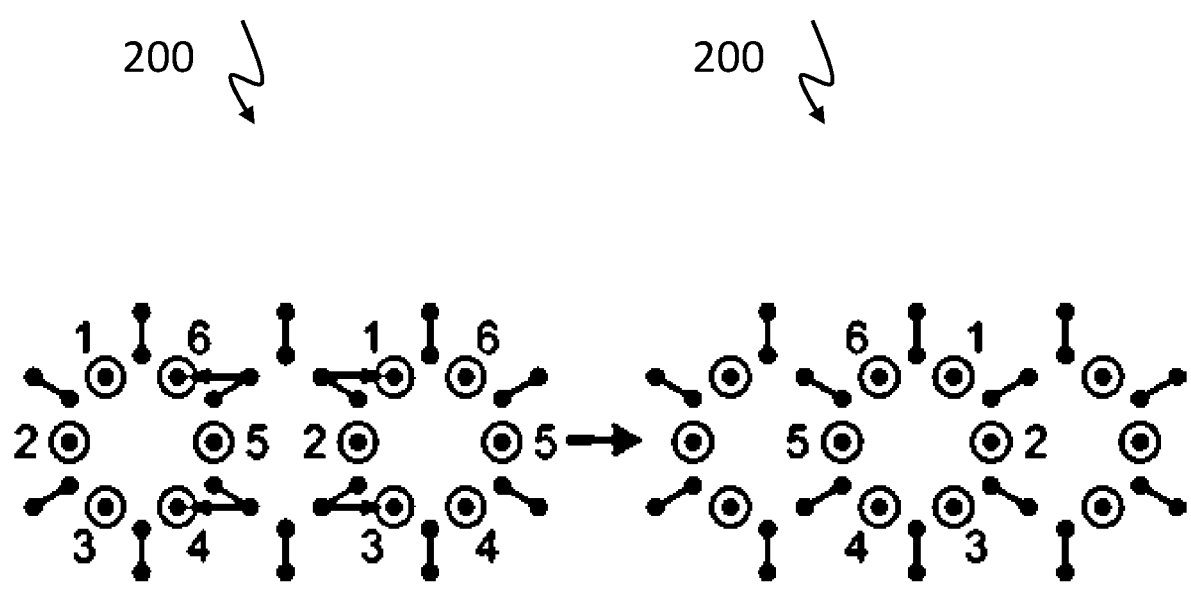
FIG. 10 shows how qubits from concatenated hexagrams can be reordered by moving the interior Majoranas.

FIG. 10 shows how qubits from concatenated hexagrams can be reordered by moving the interior Majoranas along a single edge of s1 (arrows). The CNOT gate can therefore be applied on any pair of qubits.

Example 1: Vortex Majorana Braiding in a Finite Time

Abstract: Abrikosov vortices in Fe-based superconductors are a promising platform for hosting Majorana zero modes. Their adiabatic exchange is a key ingredient for Majorana-based quantum computing. However, the adiabatic braiding process can not be realized in state-of-the-art experiments. We propose to replace the infinitely slow, long-path braiding by only slightly moving vortices in a special geometry without actually physically exchanging the Majoranas, like a Majorana carousel. Although the resulting finite-time gate is not topologically protected, it is robust against variations in material specific parameters and in the braiding-speed. We prove this analytically. Our results carry over to Y-junctions of Majorana wires.

Introduction: Recent experiments on low-dimensional superconducting structures have revealed localized electronic states at the Fermi level. Although still debated, these states can be attributed to 'half-fermionic' exotic electronic states, the Majorana zero modes. Spatially isolated Majorana zero modes are not lifted from zero energy when coupled to ordinary quasiparticles and are a key ingredient for demonstrating nonuniversal topological quantum computing, despite some susceptibility to external noise. Majorana modes have supposedly been detected at the ends of semiconducting wires, designed atomic chains with helical magnetic structures, and, in particular, at the surface of superconductors with a superficial Dirac cone, e.g., Fe-based superconductors. There, Abrikosov vortices carry spatially localized peaks in the density of states at zero bias voltage. This is called the latter vortex Majoranas.

The next milestone towards topological quantum computing as well as the final evidence for the existence of Majorana zero modes is to achieve Majorana braiding, i.e., moving two Majorana zero modes around each other adiabatically. This naive implementation of Majorana braiding in Fe-based superconductors poses major experimental problems despite the fundamental limitation that a true adiabatic evolution of perfectly degenerate levels cannot be achieved in principle. First, the length of the exchange path is on the order of micrometers such that braiding would take up to minutes in current setups, introducing high demands on sample quality, temperature, and experimental control for guaranteeing coherent transport of the vortex without intermediate quasiparticle poisoning. Second, braiding the vortices results in twisted flux lines in the bulk of the Fe-based superconductor. This induces an energetic instability, hindering braiding and eventually causing relaxation events that disturb the zero-energy subspace and thereby quantum computation.

In this manuscript, we substantially simplify the direct approach of physically braiding vortex Majoranas and show how braiding is realized within a finite time. To this end, vortex Majoranas are spatially arranged such that changing the position of one of them on a short, well-defined path is equivalent to ordinary braiding. For current experimental systems like $FeTe_xSe_{1-x}$, the allowed time scales for our braiding operation ranges from adiabatically slow up to nanoseconds. The protocol is robust against variations in material parameters and in the local speed of the vortex motion, which we prove by an analytical finite-time solution. Unwanted couplings that lift the degeneracy of the ground state are excluded by the special spatial arrangement of the vortices and additionally exponentially suppressed on the Majorana superconducting coherence length t.

For our proposal, we presume that a reliable mechanism for moving vortices is available. Tremendous progress in this regard has recently been made by moving vortices with the cantilever of a magnetic force microscope. Additionally, the controlled nanoscale assembly of vortices has been achieved with a heated tip of a scanning tunneling microscope (STM) by letting the vortices follow the locally heat-suppressed superconducting gap. Regarding our proposal, STM manipulation potentially has the advantage of simultaneously resolving the local density of states (LDOS). Eventually, positioning the vortices amounts to engineering the hybridization between Majorana modes. Therefore, the presented finite-time results carry over to Y-junctions of Majorana wires, where the hybridization between the Majorana modes at the periphery and the center is altered.

Setup: We consider three vortex Majoranas $\gamma_1, \gamma_2, \gamma_3$ at the corners of an equilateral triangle with a fourth, movable vortex Majorana $\gamma_m$ near the center, see FIG. 1. A key element of the setup is that the distances between the vortices minimize the hybridization between the exterior vortex Majoranas. In a low-energy, long distance continuum model, the hybridization strength of two vortex Majoranas is proportional to $\cos(k_F r + \pi/4) e^{-r/\xi}/\sqrt{r}$, where r is the distance between their centers and $k_F$ the Fermi momentum. Two vortex Majoranas hence decouple at distances $$r = \pi(J - 3/4)/k_F, \quad (1)$$

where j is a positive integer. The formula changes slightly for real systems and in the presence of multiple vortex Majoranas, yet negligibly as far as our results are concerned. Furthermore, thermal fluctuations in the superconducting gap Δ, which in principle set an upper limit to the temperature, can be neglected in the regime of validity of Eq. (1), which does not depend on Δ. In the setup of FIG. 1, the exterior vortices are $r_6$ away from each other, so that no hybridization takes place between them. The central vortex is moved along a path that is exactly $r_4$ away from at least one exterior vortex, which results in the braiding path shown in FIG. 2*b*. The setup has a C3 symmetry and a mirror symmetry, which we assume to hold in the following if not stated otherwise. Using $r_4$ and $r_6$ results in a particularly short braiding path on $FeTe_xSe_{1-x}$, where the superconducting Majorana coherence length is $\xi \approx 13.9$ nm. The direct distance between the exterior vortices is ~80 nm, and $\gamma_m$ is never further than ~6.5 nm away from the center. Other distances rj could perfectly be used as well, in particular for different material systems.

Braiding protocol: In the following, we provide a step-by-step recipe for finite-time Majorana braiding using $FeTe_{0.55}Se_{0.45}$ as an exemplary platform. To this end, we employ a material specific tight-binding model. We discuss the essential steps 1. arranging the vortex positions, 2. calibrating the braiding path, 3. performing the braiding gate, and 4. reading out quantum states. We first propose how to construct the setup shown in FIG. 1*a*. Consider vortex Majoranas on the surface of $FeTe_{0.55}Se_{0.45}$. In the low-field regime ≤1 T, the arrangement of the vortices is close to a triangular lattice, where the strength of the magnetic field controls the lattice constant. For the setup of FIG. 1*a*, the tight-binding model predicts an ideal edge length of $r_6$=77.3 nm, corresponding to a magnetic field of 0.36 T. The concrete experimental value can be obtained by calibration relative to this starting point. A deviation of about 0.1 nm from the perfect positions does not crucially affect the protocol. We next use the aforementioned techniques to move a vortex ($\gamma_m$) to the center of one Majorana triangle ($\gamma_1, \gamma_2, \gamma_3$) and isolate this formation by moving surrounding vortices away. Finally, we precisely adjust the positions of these four vortices such that only two zero-bias tunneling peaks appear at the positions of $\gamma_1$ and $\gamma_3$, while a small energy splitting of ~25 μeV is present at $\gamma_2$ and $\gamma_m$. Because of this energy splitting, we assume a temperature below 0.3 K for quantum information processing, which is achieved in state-of-the-art experiments. The braiding path shown in FIG. 2*b* is calibrated by ensuring that the LDOS for each vortex Majorana during the braiding process qualitatively aligns with the results shown in FIG. 2*c*. Hence, at the beginning, only γ2 and $\gamma_m$ hybridize so that γ1 and γ3 exhibit zero-bias peaks. Furthermore, $\gamma_3$ always possesses a zero-bias peak during the first third of the braiding protocol. When $\gamma_m$ moves towards $\gamma_1$, the energy splitting starts to transit from $\gamma_2$ to $\gamma_1$. The zero-bias peaks eventually appear at $\gamma_2$ and $\gamma_3$ when $\gamma_m$ is closest to $\gamma_1$. In the remaining two thirds of the braiding path, the LDOS evolves as in the first third, but with suitably permuted indices of the vortex Majoranas, see FIG. 2*c*. Importantly, two vortex Majoranas remain at zero energy throughout the whole braiding process. Furthermore, the energy splitting transits from $\gamma_2$ to $\gamma_1$ and then back to $\gamma_3$. On the other hand, the LDOS of $\gamma_m$ never possesses any zero-bias peak, as shown in FIG. 2*c*, since it always couples to another vortex Majorana. Observing the LDOS evolution for each vortex is the primary step to check successful braiding. To replace the technically demanding simultaneous measurement of the LDOS at each vortex, we first probe the LDOS at each vortex by an STM and then move the central vortex $\gamma_m$ a short step along the braiding path. We iterate this procedure along the full braiding path until $\gamma_m$ is back to the starting point. We next have to confirm the informational change after braiding. The important data from the LDOS measurement to this end are the energy splitting and the peak heights of the vortex Majoranas that have been collected in the previous step, see FIG. 2*c*. From the energy splittings, a low-energy model can be derived that determines the quantum gate operation on the degenerate ground state and its quality. The model is explained in greater detail below. Braiding is then experimentally realized by moving $\gamma_m$ along the previously saved braiding path without probing any LDOS. Finally, reading out the change of the quantum state after braiding is an important task, which has been discussed previously. In particular, the Majorana qubit can be read out either by measuring the resonant current in Coulomb blocked systems, where charge fluctuations are suppressed and quantum information is thus protected, or by interferometry. Importantly, Majorana braiding and readout are distinct processes, such that the readout time is not limited to happen on the time scale of the braiding.

Braiding: validation, quality, and robustness: To validate that Majorana braiding is realized, we consider the low-energy Hamiltonian $$H(t)=iJ[\lambda_1(t)\gamma_1+\lambda_2(t)\gamma_2+\lambda_3(t)\gamma_3]\gamma_m, \quad (2)$$

which describes the Majorana modes with energies much smaller than the one of the Caroli-de Gennes-Matricon (CdGM) states. All $\gamma_j$'s obey the Majorana algebra, $|\lambda_i(t)|\leq 1$ are time-dependent functions describing the hybridization strengths, and $J\approx 25$ µeV (for our setup on $FeTe_{0.55}Se_{0.45}$) is the maximal hybridization energy of two Majoranas. Having used decoupling distances (Eq. (1)) in-between most vortices, additional Majorana hybridizations are excluded. Similar Hamiltonians have been studied in the adiabatic limit and with projective measurements in setups for superconducting wires. The distinguishing features of our work is that we employ a time-dependent Hamiltonian and consider an experimentally realistic example system. Braiding on the time scale of GHz would tremendously outperform infinitely slow braiding. It can be shown directly that the braiding protocol works in the adiabatic regime. By the definition of the braiding path, and as shown in FIG. 2c, one of the $\lambda_i(t)$ vanishes while two of the $\lambda_i(t)$ vanish at the corners of the triangle. The vector $\lambda(t)=(\lambda_1(t), \lambda_2(t), \lambda_3(t))$ therefore encloses a spherical angle of $\pi/2$ after the braiding protocol. In the adiabatic limit, the time evolution hence converges (up to a phase) to the braiding operator $\lim T\to\infty U(T)\propto 1-\gamma_1\gamma_2\propto B_{1,2}$. To describe the non-adiabatic regime, we fit the low-energy parameters of Eq. (2) to the realistic tight-binding model, see FIG. 4a, allowing us to employ explicit Runge-Kutta methods for the numerical simulation of the time evolution. Because we assume C3- and mirror symmetry to hold during the braiding process, we symmetrize the tight-binding data accordingly. Deviations from these symmetries can introduce small errors. To show that Majorana braiding is realized, we use two indicators. These are the amount of quasiparticle excitations $|q|^2$ and the phase difference $\varphi$ between ground states of different parity. In particular, $|q|^2$ is the probability of leaving the degenerate ground state by the finite-time manipulation of the vortex positions, and the phase $\varphi$ is an extension of the Berry phase to finite-time processes. We neglect other sources of quasiparticle excitations, assuming a temperature below 0.3 K, as stated above. As shown in FIG. 4b and FIG. 4c, we find that the quasiparticle excitations $|q|^2$ and the deviation of the finite-time Berry phase $\varphi$ from $\pi/2$ vanish simultaneously at times Tn. Thereby, perfect finite-time braiding is achieved at times $T_n$ without physically braiding vortex Majoranas. In $FeTe_xSe_{1-x}$ the corresponding time scales are larger than 0.24 ns. This time scale is much slower than the time scale corresponding to excitations of CdGM states $\hbar E_F/\Delta^2\approx 3.33$ ps, where $\Delta$ is the size of the superconducting gap and $E_F$ the Fermi energy. The braiding protocol could be susceptible to variations in material parameters or the local speed of $\gamma_m$. In the following, we prove that these deviations are irrelevant by analytically solving a time-dependent Hamiltonian. We also find numerically that quasiparticle excitations stemming from slightly misplaced vortices are insignificant. If the time-dependent hybridization strengths along edge 3 of FIG. 2b take the form $$\lambda_1(t)=\sin(3\pi t/2T), \lambda_2(t)=\cos(3\pi t/2T), \lambda_3(t)=0, \quad (3)$$

the time evolution along edge 3 can analytically be given as $U_{2,1}$, where $$U_{j,k}(t)=e^{-\gamma_j\gamma_k\,3\pi t/4T}e^{\gamma_j\gamma_m\,Jt/\hbar+\gamma_j\gamma_k\,3\pi t/4T}. \quad (4)$$

That Eq. (4) is the solution of the Schrödinger equation is verified. The solution is obtained by a rotating-wave ansatz and by solving a time-independent differential equation. Notably, the exact time-evolution of Eq. (4) is equivalent to adiabatic braiding $U_{i,j}(T_n)=B_{i,j}$ at times $$T_n=3\pi(n^2-1/16)^{1/2}\hbar/J, \quad (5)$$

where n is a positive integer. The time evolution for moving $\gamma_m$ along all three edges is $U(T)=U_{3,2}(T)U_{1,3}(T)U_{2,1}(T)$. Hence $U(T_n)\propto B_{1,3}$. The analytic model therefore realizes analytically proved perfect braiding by moving $\gamma_m$ along a short path in a finite time.

We next consider the case where $\gamma_m$ is on edge 3 and the hybridizations $\lambda 1(t)$ and $\lambda_2(t)$ differ from the analytic solution but still keep $\lambda_3(t)=0$. This is the case for the realistic tight-binding model. The general time evolution that respects mirror and C3 symmetry is $U^g_{2,1}$ with $$U^g_{j,k}(T)=b_1(T)+b_2(T)\gamma_j\gamma_m+b_3(T)\gamma_m\gamma_k+b_4(T)\gamma_k\gamma_j, \quad (6)$$

where $b_i(T)$ are real coefficients. Additional terms are excluded by the reduced number of Majorana hybridizations and by mirror symmetry. The complete time evolution operator along all three edges is $$U^g(T)=U^g(T)_{3,2}U^g(T)_{1,3}U^g(T)_{2,1}. \quad (7)$$

The probability to excite quasiparticles after a full passage of $\gamma m$ along the braiding path is $|q^g|^2$ with $$q^g(T) = Tr\{(\gamma_1 + i\gamma_2)(\gamma_3 + i\gamma_m)U^g(T)\}/4 = \\ \sqrt{2}\ e^{i\pi/4}(b_4(T) - b_1(T))\left(1 - \left(\sum_i b_i(T)\right)^2\right). \quad (8)$$

The amount of quasiparticle excitations is hence given by a product of real polynomials. For example, the analytical model of Eq. (3) results in $$q^a=e^{i\pi/4}(\pi^3\sin(\theta/2)/2\theta^3[J/\hbar\omega\theta/2\pi\sin(\theta)-\cos(\theta)-J^2/\hbar^2\omega^2],$$

with $\theta=\pi(J^2+\hbar^2\omega^2)^{1/2}/\hbar\omega$ and $\omega=3\pi/(4T)$. (9)

At times $T_n$, see Eq. (5), and additional transcendental times, the quasiparticle excitations $|q^a|^2$ hence vanish. In real systems, q generally differs from the analytical solution, but remains a product of the real polynomials $b_1$-$b_4$, and $1-(\sum_i b_i)^2$, each of which is continuously connected to its counterpart in the analytical solution. Single zeros of q are therefore shifted but not lifted by small deviations. Only large deviations eventually annihilate two zeros simultaneously. In particular, the low-energy model extracted from the realistic tight-binding calculations deviates significantly from the analytically solvable protocol, cf. FIG. 4a. Yet, the zeros of q persist and only shift slightly as shown in FIG. 4b. To finally analytically verify perfect braiding, we consider the finite-time extension of the Berry phase given by the phase difference $$\varphi=\arg\{<0|U^g|0>/<1|U^g|1>\} \quad (10)$$

between the states $|0>$ and $|1>=(\gamma_2-i\gamma_m)|0>$. In the adiabatic limit, $\varphi$ equals the Berry phase, which is $\pi/2$ for Majorana braiding. We find that $\varphi=\pi/2$, i.e., perfect braiding, at the zeros of q where $b_1(T)=b_4(T)$ in Eq. (9), as shown in FIG. 4)c These are exactly the zeros corresponding to $T_n$ of Eq. (5) in the analytical model.

Conclusions: We show that Majorana braiding with superconducting vortices can be achieved robustly and in finite time by only slightly moving the vortices. The procedure avoids a long-time, incoherent, physical braiding process. We simulate the protocol in a realistic, material-specific tight-binding model and prove its robustness against variations of material parameters and a nonconstant braiding speed by an analytically solvable time-dependent model. Perfect braiding without physically braiding Majoranas therefore becomes possible in systems, where the superconducting coherence length at the surface ξ is comparable to the Fermi wave length. This requirement is met by $FeTe_x Se_{1-x}$. If ξ is much larger, controlled vortex manipulation becomes impractical, whereas if t is much smaller, the Majorana hybridizations fall below current experimental resolution. The finite-time braiding ultimately relies on tuning the coupling between Majorana modes. Therefore, the scheme can also be realized in Y-junctions of 1 D topological superconductors or by inserting and moving magnetic or nonmagnetic adatoms in between vortex Majoranas. Alternatively, the positions of anomalous vortices carrying Majorana modes could directly be manipulated.

Example 2

The above example is in the following extended to explain the CNOT as well as the π/8 (magic) and π/12 phase gates resulting in a scalable scheme for finite-time Majorana quantum computing without physically braiding vortices, see Ref. [1].

CNOT gate: The CNOT gate is realized by a consecutive execution of braiding gates marked in the hexagram in FIG. 1c. In particular, the CNOT gate may be realized by CNOT= [B(6,1) B(3,4)] [B(2,3) B(3,4) B(4,5) B(3,4) B(2,3)], where B(a,b) denotes the braiding gate operation between Majoranas γa and and γb, which may be realized as described in EXAMPLE 1 and above. It is straightforward to achieve this in our setup by performing finite-time braiding gates on the respective triangular elementary cells. On a triangular lattice of n hexagrams, see FIG. 1b, the number of free Majoranas scales with n. The hexagram is the simplest possible unit cell with this scaling behavior. For simpler ones, the number of free Majoranas scales with in. The qubits belonging to different hexagrams in the lattice can be shifted, such that the CNOT gate can be applied to arbitrary assemblies of free Majoranas, see FIG. 10. This may be achieved by moving interior Majoranas only one edge along their paths s1 such that a braiding gate is realized in finite time.

π/8 (magic) and π/12 phase gate: Further phase gates besides the braiding gate can be realized with the particular setup, in particular the π/8 (magic) and the π/12 phase gate. This may be obtained in finite times up to the GHz regime by moving the mediating Majorana $γ_m$ along the paths s2 (magic gate) and s3 (π/12 phase gate) of FIG. 1a. Together with the braiding gate and the CNOT gate discussed above, this forms a set of complete gates for universal quantum computing.

We proceed as above and regard the probability $|q|^2$ for unwanted quasiparticle excitations and the non-adiabatic extension of the Berry phase difference φ on the degenerate ground states for moving $γ_m$ along s2. The results for the magic gate are shown in FIGS. 9a and 9b. The analytical function q for the unwanted quasiparticle excitations of the magic gate, has zeros at specific process times similar to the behavior of the finite-time braiding gate shown in FIGS. 4b and 4c. At every fifth of these zeros, the Berry phase difference φ simultaneously vanishes.

Example 3: Unwanted Couplings and Breaking of C3 Symmetry

The proposed scheme is unexpectedly robust against variations in the residual couplings between the Majorana modes as long as the C3 symmetry of the setup, cf. FIG. 1a, is maintained. In this section, we give numerical evidence how unwanted quasiparticle excitations and deviations in the phase difference φ emerge if the C3 symmetry is slightly broken or if residual couplings are included that lift the degeneracy of the zero-energy subspace. To this end, we employ the protocol shown in FIG. 7a-c, which slightly breaks the C3 symmetry, and incorporate the unwanted residual couplings a/J=0.3%, b/J=0.9%, and c/J=1.4%, see Eq. (S11), which respect a 0.1 nm deviation from the perfect positions of the vortices. As shown in FIG. 8a, residual couplings are not increasing the unwanted quasiparticle excitations as long as the C3 symmetry is not broken. Only breaking the C3 symmetry results in additional quasiparticle poisoning, which can be suppressed to less than 10^(−6) by choosing an appropriate braiding time. Regarding the finite-time Berry phase, residual couplings introduce a time-dependent additional phase that needs to be compensated for, cf. FIG. 8b. This additional dynamical phase is expected, because unwanted couplings lift the ground state degeneracy [45, 46]. However, a deviation from the braiding phase may turn out to be a merit and not a deficiency. Each zero of the unwanted quasiparticle excitations corresponds to the realization of an additional phase gate. This has the advantage that different braiding speeds realize different phase gates (e.g., also the π/8 magic phase gate, which can be obtained in another way described above).

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing a claimed invention, from a study of the drawings, the disclosure, and the dependent claims.

In the claims, the word "comprising" does not exclude other elements or steps, and the indefinite article "a" or "an" does not exclude a plurality. The mere fact that certain measures are re-cited in mutually different dependent claims does not indicate that a combination of these measures cannot be used to advantage. Any reference signs in the claims should not be construed as limiting the scope.

LIST OF REFERENCE SIGNS 100 quantum computing unit
110 superconducting substrate
120 outer Majorana mode
130 inner Majorana mode
140 outer perimeter
150 one-dimensional topological superconductor
160 defined path
170 equilateral triangle
180 gate
200 quantum computing array
210 groove mesh
220 island of second superconducting material
230 concave bay
240 node of the groove mesh

What is claimed:

1. A quantum computing unit comprising a superconducting substrate, at least three outer Majorana modes, and at least one inner Majorana mode,
   wherein the at least three outer Majorana modes are located along an outer perimeter, and
   wherein the at least one inner Majorana mode is located within the outer perimeter at least proximal to the superconducting substrate;
   wherein the outer Majorana modes and the inner Majorana mode are moved relative to each other such that the inner Majorana mode moves relative to the outer Majorana modes along a defined path proximal to the center of the outer perimeter;
   wherein the outer Majorana modes and the inner Majorana mode are moved relative to each other along a defined path non-adiabatically in a defined finite time; and
   wherein execution of a gate in the quantum computing unit operates without measurements of a state of the quantum computing unit.

2. The quantum computing unit according to claim 1, wherein the at least three outer Majorana modes are located along the outer perimeter at least proximal to the superconducting substrate.

3. The quantum computing unit according to claim 1, further comprising a network of one-dimensional topological superconductors,
   wherein the at least three outer Majorana modes are located along the outer perimeter on the one-dimensional topological superconductors and spatially separated from the superconducting substrate.

4. The quantum computing unit according to claim 3, wherein a motion of the outer Majorana modes relative to the superconducting substrate is caused by applying an electric field.

5. The quantum computing unit according to claim 3, wherein a motion of the outer Majorana modes relative to the superconducting substrate is caused by changing a magnetic field or the magnetization of at least a part of the quantum computing unit.

6. The quantum computing unit according to claim 1, wherein the at least three outer Majorana modes are equidistantly arranged.

7. The quantum computing unit according to claim 1, wherein one Majorana mode is located within an equilateral triangle which is formed by three Majorana modes out of the at least three outer Majorana modes.

8. The quantum computing unit according to claim 1, wherein the center of the inner Majorana mode is arranged in the center of a circular outer perimeter.

9. The quantum computing unit according to claim 1, wherein the defined path is approximately along arcs of circles with defined radii that connect corners of an equilateral triangle within the outer perimeter of the outer Majorana modes.

10. The quantum computing unit according to claim 1, wherein the defined path is approximately along a symmetrical half of an outer contour formed by arcs of circles with defined radii that connect corners of an equilateral triangle.

11. The quantum computing unit according to claim 1, wherein the defined path is approximately along a symmetrical third of an outer contour formed by arcs of circles with defined radii that connect corners of an equilateral triangle.

12. The quantum computing unit according to claim 1, wherein the movement of the inner Majorana mode relative to the outer Majorana modes along the defined path changes a distance of the inner Majorana mode to at least one of the outer Majorana modes, wherein the change of the distance results in a change of hybridization of the inner Majorana mode with the at least one of the outer Majorana modes.

13. The quantum computing unit according to claim 1, wherein a material of the superconducting substrate is $FeTe_xSe_{1-x}$.

14. The quantum computing unit according to claim 1, wherein a material of the first superconducting substrate is $FeTe_{0.55}Se_{0.45}$.

15. The quantum computing unit according to claim 1, wherein a motion of the inner Majorana mode relative to the superconducting substrate is caused by the tip of a scanning tunneling microscope or the cantilever of an atomic force microscope.

16. The quantum computing unit according to claim 1, wherein a hybridization of a pair of Majorana modes is altered by at least one of changing the size of Majorana modes or manipulating an area in-between a pair of Majorana modes with electromagnetic fields or magnetic and nonmagnetic adatoms.

17. A quantum computing array comprising a plurality of quantum computing units,
   each of the plurality of quantum computing units comprising:
      a superconducting substrate, at least three outer Majorana modes, and at least one inner Majorana mode,
      wherein the at least three outer Majorana modes are located along an outer perimeter, and
      wherein the at least one inner Majorana mode is located within the outer perimeter at least proximal to the superconducting substrate;
      wherein the outer Majorana modes and the inner Majorana mode are moved relative to each other such that the inner Majorana mode moves relative to the outer Majorana modes along a defined path proximal to the center of the outer perimeter;
      wherein the outer Majorana modes and the inner Majorana mode are moved relative to each other along a defined path non-adiabatically in a defined finite time; and
      wherein execution of a gate in the quantum computing unit operates without measurements of a state of the quantum computing unit.

18. The quantum computing array of claim 17, wherein the superconducting substrate of each of the quantum computing units is a common superconducting substrate so that the outer Majorana modes and the inner Majorana modes of the respective quantum computing units are arranged with respect to the same superconducting substrate.

19. The quantum computing array of claim 17, wherein adjacent quantum computing units share a common outer Majorana mode.

20. The quantum computing array of claim 17, wherein each two of the outer Majorana modes of six quantum computing units out of the plurality of quantum computing units are arranged in a hexagon, wherein adjacent quantum computing units share a common outer Majorana mode.

21. The quantum computing array of claim 17, wherein the outer Majorana modes of the plurality of quantum computing units are arranged in a pattern corresponding to medians/centers of sides of a honeycomb structure.

22. The quantum computing array of claim 17, wherein six Majorana modes are manipulated by seven consecutive braiding gates to realize a CNOT quantum gate, where the Majorana modes are labeled from 1 to 6 arbitrarily, and the braiding gates are applied to the Majorana pairs 2 and 3, 3 and 4, 4 and 5, 3 and 4, 2 and 3 in that order and afterwards to 3 and 4 as well as 6 and 1 in arbitrary order.

23. The quantum computing array of claim 17, further comprising a second superconducting material grown onto the common superconducting substrate, wherein the second superconducting material has formed a grove mesh thereon, wherein the grove mesh surrounds islands of the second superconducting material, wherein the outer Majorana modes are arranged with respect to the superconducting substrate layer in the center of groves of the grove mesh of the second superconducting material.

24. The quantum computing array of claim 23, wherein the islands have concave bays opposite the respective outer Majorana modes forming a cage for maintaining the location of the respective outer Majorana modes.

25. The quantum computing array of claim 23, wherein centers of the inner Majorana modes are located at nodes of the grove mesh.

26. The quantum computing array of claim 25, wherein the islands have concave bays opposite the respective inner Majorana modes forming a cage for limiting a motion range of the respective inner Majorana modes.

27. The quantum computing array of claim 23, wherein a material of the second superconducting material is a material having a higher critical superconducting temperature than the operating temperature of the quantum computing array.

\* \* \* \* \*